United States Patent
Seo et al.

(10) Patent No.: US 7,399,991 B2
(45) Date of Patent: Jul. 15, 2008

(54) ORGANIC LIGHT EMITTING DEVICE AND DISPLAY DEVICE USING THE SAME

(75) Inventors: Satoshi Seo, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 10/081,558

(22) Filed: Feb. 20, 2002

(65) Prior Publication Data

US 2002/0113546 A1  Aug. 22, 2002

(30) Foreign Application Priority Data

Feb. 22, 2001  (JP)  ............... 2001-045883

(51) Int. Cl.
*H05B 33/14* (2006.01)
(52) U.S. Cl. ........... 257/79; 257/40; 257/E51.043; 257/E51.019; 257/E51.051; 428/690
(58) Field of Classification Search ........ 257/79, 257/40, 89, 72; 428/690, 323, 328, 480; 250/515.1, 519.1; 252/510, 511, 500, 512, 252/513
See application file for complete search history.

(56) References Cited

U.S. PATENT DOCUMENTS

| | | | |
|---|---|---|---|
| 3,654,525 A | 4/1972 | Maricle et al. | |
| 5,017,863 A | 5/1991 | Mellitz | |
| 5,039,657 A | 8/1991 | Goldman et al. | |
| 5,170,990 A | 12/1992 | Kamiya et al. | |
| 5,256,945 A | 10/1993 | Imai et al. | |
| 5,271,089 A | 12/1993 | Ozawa | |
| 5,281,489 A | 1/1994 | Mori et al. | |
| 5,294,810 A | 3/1994 | Egusa et al. | |
| 5,486,406 A | 1/1996 | Shi | |
| 5,513,499 A | 5/1996 | DeRijke | |

(Continued)

FOREIGN PATENT DOCUMENTS

EP  0 390 551 A2  10/1990

(Continued)

OTHER PUBLICATIONS

Tang et al. "Organic electroluminescent diodes." Applied Physics Letters 51(12): 1987. p. 913-915.

(Continued)

*Primary Examiner*—A. Sefer
(74) *Attorney, Agent, or Firm*—Fish & Richardson P.C.

(57) ABSTRACT

An organic compound film is composed of a hole transporting region, a first mixed region, a light emitting region, a second mixed region, and an electron transporting region that are connected to one another. With the organic compound film thus structured, the blue organic light emitting device obtained is free from interfaces between layers which are present in the conventional laminate structure. When pigment doping is added to this device structure, a white organic light emitting device is obtained. A blue or white organic light emitting device having high light emission efficiency and long lifetime is provided by this method. When this organic light emitting device is combined with color conversion layers or color filters, a full color display device that consumes less power and lasts long can be obtained.

9 Claims, 24 Drawing Sheets

U.S. PATENT DOCUMENTS

| | | |
|---|---|---|
| 5,719,467 A | 2/1998 | Antoniadis et al. |
| 5,747,183 A | 5/1998 | Shi et al. |
| 5,817,431 A | 10/1998 | Shi et al. |
| 5,853,905 A | 12/1998 | So et al. |
| 5,858,563 A | 1/1999 | Sano et al. |
| 5,925,472 A | 7/1999 | Hu et al. |
| 5,925,980 A | 7/1999 | So et al. |
| 5,955,836 A | 9/1999 | Boerner et al. |
| 5,989,737 A | 11/1999 | Xie et al. |
| 6,030,715 A | 2/2000 | Thompson et al. |
| 6,068,940 A | 5/2000 | Tanaka |
| 6,091,195 A * | 7/2000 | Forrest et al. ............... 313/504 |
| 6,097,147 A | 8/2000 | Baldo et al. |
| 6,121,727 A | 9/2000 | Kanai et al. |
| 6,130,001 A | 10/2000 | Shi et al. |
| 6,132,280 A | 10/2000 | Tanabe et al. |
| 6,215,462 B1 | 4/2001 | Yamada et al. |
| 6,228,228 B1 | 5/2001 | Singh et al. |
| 6,237,529 B1 | 5/2001 | Spahn |
| 6,271,543 B1 * | 8/2001 | Ohtani et al. ................. 257/72 |
| 6,275,649 B1 | 8/2001 | Nagashima et al. |
| 6,284,050 B1 | 9/2001 | Shi et al. |
| 6,285,039 B1 | 9/2001 | Kobori et al. |
| 6,310,360 B1 | 10/2001 | Forrest et al. |
| 6,326,091 B1 | 12/2001 | Schoo et al. |
| 6,368,730 B1 | 4/2002 | Kishimoto et al. |
| 6,372,154 B1 | 4/2002 | Li |
| 6,384,529 B2 * | 5/2002 | Tang et al. ................... 313/506 |
| 6,392,250 B1 | 5/2002 | Aziz et al. |
| 6,392,339 B1 * | 5/2002 | Aziz et al. ................... 313/504 |
| 6,396,209 B1 | 5/2002 | Kido et al. |
| 6,413,656 B1 | 7/2002 | Thompson et al. |
| 6,432,255 B1 | 8/2002 | Sun et al. |
| 6,447,934 B1 | 9/2002 | Suzuki et al. |
| 6,454,966 B1 * | 9/2002 | Kobayashi et al. ..... 252/301.35 |
| 6,458,475 B1 | 10/2002 | Adachi et al. |
| 6,468,676 B1 | 10/2002 | Ueda et al. |
| 6,495,198 B2 | 12/2002 | Peng |
| 6,517,996 B1 | 2/2003 | Chao et al. |
| 6,528,824 B2 | 3/2003 | Yamagata et al. |
| 6,541,909 B1 | 4/2003 | Motomatsu |
| 6,558,817 B1 | 5/2003 | Ueda et al. |
| 6,559,065 B2 | 5/2003 | Kawashima |
| 6,566,807 B1 | 5/2003 | Fujita et al. |
| 6,603,140 B2 | 8/2003 | Kobori et al. |
| 6,614,175 B2 * | 9/2003 | Aziz et al. ................... 313/504 |
| 6,682,782 B2 | 1/2004 | Jung et al. |
| 6,759,144 B2 | 7/2004 | Toguchi et al. |
| 6,803,720 B2 | 10/2004 | Kwong et al. |
| 6,831,406 B1 | 12/2004 | Fukuyama et al. |
| 7,173,370 B2 | 2/2007 | Seo et al. |
| 7,196,360 B2 | 3/2007 | Seo et al. |
| 2001/0051207 A1 * | 12/2001 | Yamagata et al. ............. 427/58 |
| 2002/0038867 A1 | 4/2002 | Kobori et al. |
| 2002/0074935 A1 | 6/2002 | Kwong et al. |
| 2002/0086180 A1 | 7/2002 | Seo et al. |
| 2002/0093283 A1 | 7/2002 | Seo et al. |
| 2002/0101154 A1 | 8/2002 | Seo et al. |
| 2002/0105005 A1 | 8/2002 | Seo et al. |
| 2002/0109136 A1 | 8/2002 | Seo et al. |
| 2002/0113546 A1 * | 8/2002 | Seo et al. .................... 313/504 |
| 2002/0121860 A1 | 9/2002 | Seo et al. |
| 2002/0139303 A1 * | 10/2002 | Yamazaki et al. ........... 118/719 |
| 2002/0155632 A1 | 10/2002 | Yamazaki et al. |
| 2003/0010288 A1 | 1/2003 | Yamazaki et al. |
| 2003/0071565 A1 * | 4/2003 | Hatwar et al. ............... 313/504 |
| 2003/0118950 A1 | 6/2003 | Chao et al. |
| 2005/0266172 A1 * | 12/2005 | Kay et al. .................... 427/561 |

FOREIGN PATENT DOCUMENTS

| | | | |
|---|---|---|---|
| EP | 0 857 007 | | 8/1998 |
| EP | 1 011 155 | | 6/2000 |
| EP | 1 056 141 | A2 | 11/2000 |
| EP | 1 065 737 | | 1/2001 |
| EP | 1 154498 | * | 11/2001 |
| EP | 1 220 340 | | 7/2002 |
| JP | 02-261889 | | 10/1990 |
| JP | 03-114197 | | 5/1991 |
| JP | 3-190088 | * | 8/1991 |
| JP | 04-357694 | | 12/1992 |
| JP | 05-182762 | | 7/1993 |
| JP | 08-330073 | | 12/1996 |
| JP | 10-162955 | | 6/1998 |
| JP | 10-233288 | | 9/1998 |
| JP | 10-289784 | | 10/1998 |
| JP | 10-330743 | | 12/1998 |
| JP | 11-329734 | | 11/1999 |
| JP | 2000-182768 | | 6/2000 |
| JP | 2000-182771 | * | 6/2000 |
| JP | 2000-208262 | | 7/2000 |
| JP | 2000-340361 | | 12/2000 |
| JP | 2000-344691 | | 12/2000 |
| JP | 2001-023776 | | 1/2001 |
| JP | 2001-52866 | * | 2/2001 |
| JP | 2001-52870 | * | 2/2001 |
| TW | 243470 | | 3/1995 |
| TW | 366598 | | 8/1999 |
| TW | 451601 | | 8/2001 |
| WO | WO98/08360 | | 2/1998 |
| WO | WO02-047457 | | 6/2002 |
| WO | WO 02/47457 | A2 | 6/2002 |

OTHER PUBLICATIONS

Kijima et al. "A blue organic light emitting diode." Jpn. J. Appl. Phys. 38: 1999. p. 5274-5277.

C. Adachi et al. "Electroluminescence in organic films with three-layer structure." Jpn. J. Appl. Phys. 27(2): 1988. p. L269-L271.

C. W. Tang et al. "Electroluminescence of doped organic thin films." J. Appl. Phys. 65(9): 1989. p. 3610-3616.

"New Aspect of Research and Development of Organic EL." M&BE Seminar, Bulletin of Organic Molecular/Bioelectronics Subcommittee, Society of Applied Physics, 11(1): 2000. p. 3-12.

T. Wakimoto et al. "Organic EL cells using alkaline metal compounds as electron injection materials." IEEE Transactions on Electron Devices 44(8): 1997. p. 1245-1248.

S.A. Van Slyke et al. "Organic electroluminescent devices with improved stability." Appl. Phys. Lett. 69(15): 1996. p. 2160-2162.

D.F. O'Brien et al. "Improved energy transfer in electrophosphorescent devices." Appl. Phys. Lett. 74(3): 1999. p. 442-444.

T. Tsutsui et al. "High quantum efficiency in organic light-emitting devices with iridium-complex as a triplet emissive center." Jpn. J. Appl. Phys. 38: 1999. p. L1502-L1504.

T. Tsutsui et al. "The operation mechanism and the light emission efficiency of the organic EL element." Text of the Third Lecture Meeting, Bulletin of Organic Molecular/Bioelectronics Subcommittee, Society of Applied Physics, p. 31-37.

J. Kido et al. "Multilayer white light-emitting organic electroluminescent device." Science 267: 1995. p. 1332-1334.

Satoshi Seo et al., U.S. Appl. No. 10/043,786, filed Jan. 10, 2002.

Satoshi Seo et al., U.S. Appl. No. 10/043,812, filed Jan. 10, 2002.

Satoshi Seo et al., U.S. Appl. No. 10/060,427, filed Jan. 29, 2002.

Shunpei Yamazaki et al., U.S. Appl. No. 10/062,005, filed Jan. 31, 2002.

Satoshi Seo et al., U.S. Appl. No. 10/072,507, filed Feb. 5, 2002.

Shunpei Yamazaki et al., U.S. Appl. No. 10/072,310, filed Feb. 5, 2002.

Shunpei Yamazaki et al., U.S. Appl. No. 10/081,971, filed Feb. 20, 2002.

Hirokazu Yamagata et al., U.S. Appl. No. 09/852,090, filed May 10, 2001.

Satoshi Seo et al., U.S. Appl. No. 10/026,064, filed Dec. 21, 2001.

Satoshi Seo et al., U.S. Appl. No. 10/024,699, filed Dec. 21, 2001.

Takeshi Nishi et al., "High Efficiency TFT-OLED Display with Iridium-Complex As Triplet Emissive Center", *Proceedings of the 10th International Workshop on Inorganic and Organic Electroluminescence*, pp. 353-356, Dec. 4-7, 2000.

Foreign communication for Singapore Patent Application No. 200200037-0 including, Search Report and Written Opinion (8 pages).

Foreign communication for Singapore Patent Application No. 200200836-5 including, Search Report and Written Opinion (9 pages).

Foreign communication for Singapore Patent Application No. 200200836-5 including, Search Report and Written Opinion (9 pages).

Singapore search and examination report (Application No. 200200037.0), dated Nov. 18, 2003, 8 pages.

Office Action (Korean Application No. 10-2002-0009596) mailed Jan. 25, 2008 with full English language translations, 14 pages.

\* cited by examiner

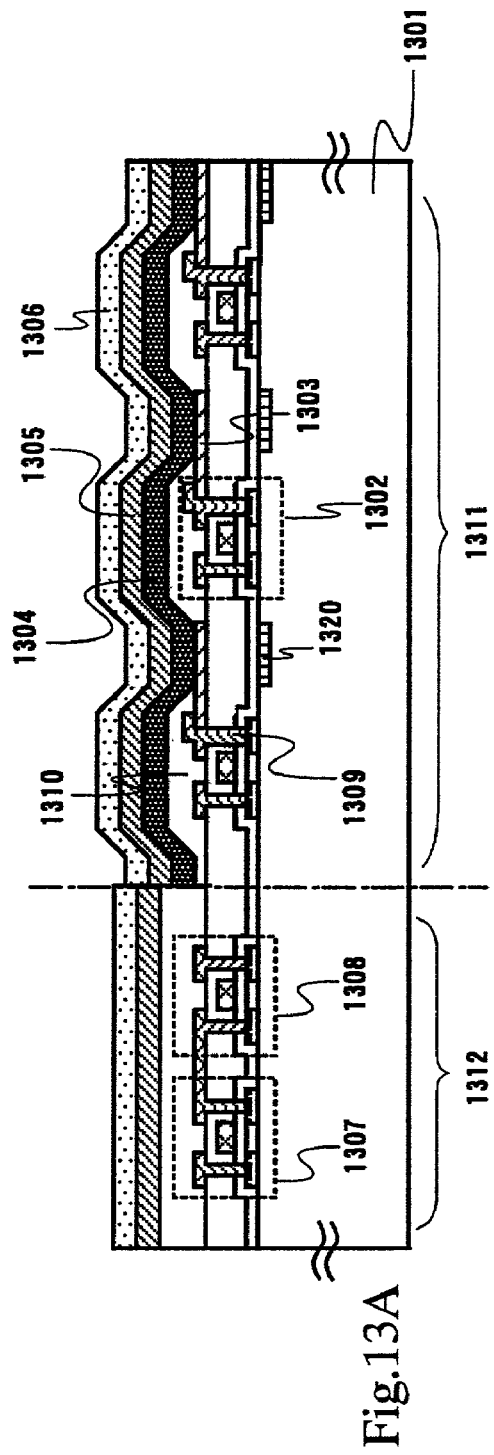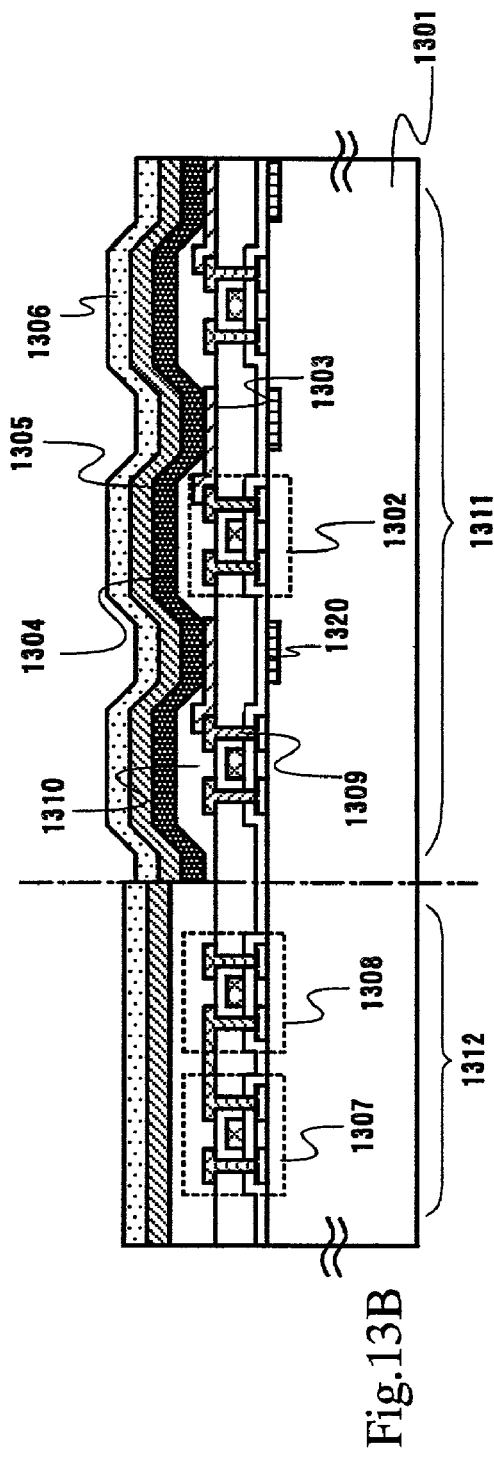
Fig.13A
Fig.13B

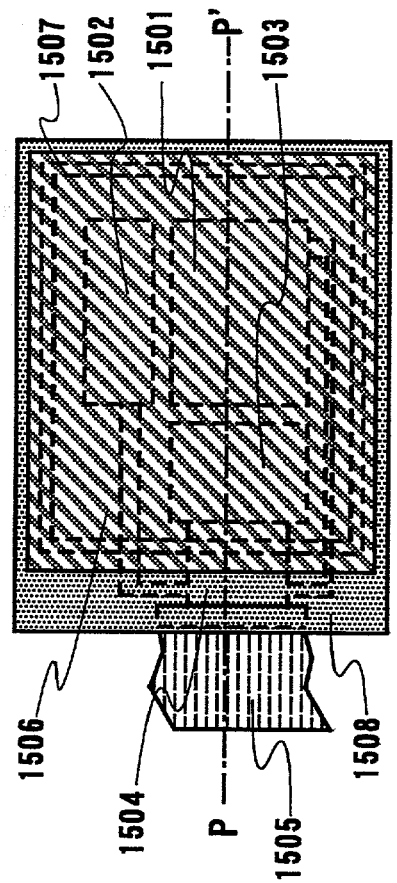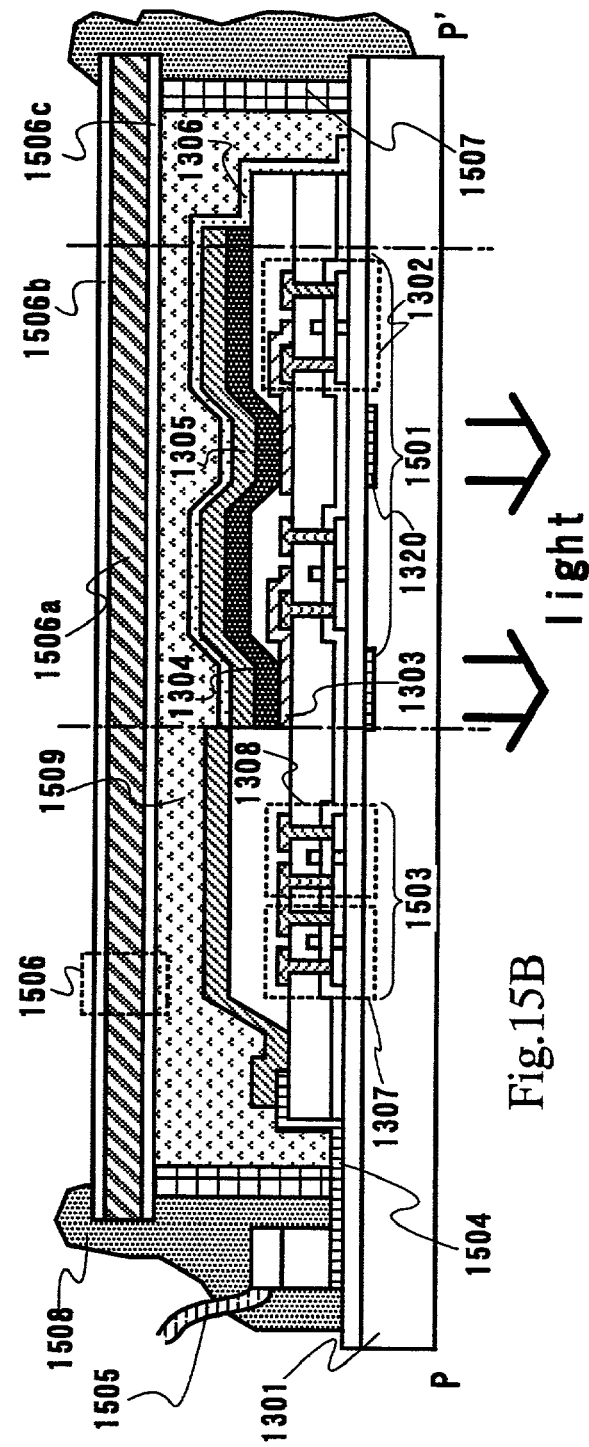
Fig.15A
Fig.15B

TAB tape

Fig.20A  Fig.20B

1 Frame

SF1-SF6:sub-frame, $T_A$: write in time

ORGANIC LIGHT EMITTING DEVICE AND DISPLAY DEVICE USING THE SAME

BACKGROUND OF THE INVENTION

1. Field of the Invention

The present invention relates to a display device using an organic light emitting device that has an anode, a cathode, and a film containing an organic compound that emits light by application of electric field (hereinafter referred to as organic compound film). Specifically, the present invention relates to a full color display device using a blue organic light emitting device or a white organic light emitting device that has higher light emission efficiency and longer lifetime than conventional ones. The term display device in this specification refers to an image display device that employs as a light emitting device an organic light emitting device. Also included in the definition of the display device are: a module in which a connector, such as an anisotropic conductive film (FPC: flexible printed circuit), a TAB (tape automated bonding) tape, or a TCP (tape carrier package), is attached to an organic light emitting device; a module in which a printed wiring board is provided on the tip of a TAB tape or a TCP; and a module in which an IC (integrated circuit) is mounted directly to an organic light emitting device by the COG (chip on glass) method.

2. Description of the Related Art

An organic light emitting device is a device that emits light when electric field is applied. Light emission mechanism thereof is said to be as follows. A voltage is applied to an organic compound film sandwiched between electrodes to cause recombination of electrons injected from the cathode and holes injected from the anode in the organic compound film and, when the resultingly excited molecule (hereinafter referred to as molecular exciton) returns to base state to release energy in the form of light emission.

There are two types of molecular excitons from organic compounds; one is singlet exciton and the other is triplet exciton. This specification includes both cases where singlet excitation causes light emission and where triplet excitation causes light emission.

In an organic light emitting device such as the above, its organic compound film is usually a thin film with a thickness of less than 1 µm. In addition, the organic light emitting device does not need back light used in conventional liquid crystal displays because it is a self-light emitting device and the organic compound film itself emits light. The organic light emitting device is therefore useful in manufacturing a very thin and light-weight display device, which is a great advantage.

When the organic compound film is about 100 to 200 nm in thickness, for example, recombination takes place within several tens nanoseconds after injecting carriers, based on the mobility of the carriers in the organic compound film. Considering, the process from carrier recombination to light emission, the organic light emitting device is readied for light emission in microseconds. Accordingly, quick response is also one of the advantages of the organic light emitting device.

Since the organic light emitting device is of carrier injection type, it can be driven with a direct-current voltage and noise is hardly generated. Regarding a drive voltage, a report says that a sufficient luminance of 100 cd/m$^2$ is obtained at 5.5 V by using a very thin film with a uniform thickness of about 100 nm for the organic compound film, choosing an electrode material capable of lowering a carrier injection barrier against the organic compound film, and further introducing the hetero structure (two-layer structure) (Reference 1: C. W. Tang and S. A. VanSlyke, "Organic electroluminescent diodes", Applied Physics Letters, vol. 51, no. 12, 913-915 (1987)).

With those features, including being thinner and lighter, quick response, and direct current low voltage driving, an organic light emitting device is attracting attention as a next-generation flat panel display device. In addition, with being a self-light emitting type and a wide viewing angle, the organic light emitting device has better visibility and is considered as effective especially in using for a display screen of portable equipment.

Another feature of organic light emitting devices is emission of light of various colors. The well varied colors are derived from the diversity of organic compounds. In other words, the various colors are derived from the flexibility, with which materials emitting different colors can be developed by designing a molecule (introduction of a substituent, for example).

From these points, it is safe to say that the most promising application field of organic light emitting devices is in full color flat panel displays. Various methods have been devised to display full color while considering the characteristics of organic light emitting devices. Currently, there are three major methods for manufacturing a full color display device using an organic light emitting device.

One of those major methods is to separately form an organic light emitting device that emits red light, an organic light emitting device that emits green light, and an organic light emitting device that emits blue light using a shadow mask technique. Red, green, and blue are the primary three colors of light, and each of the three types of organic light emitting devices makes one pixel. This method is hereinafter referred to as a separate formation method. Another one of the major methods obtains the primary three colors of light by using a blue organic light emitting device as a light emission source and converting the blue light into green light and red light through color conversion layers (CCM) that are formed of organic fluorescent materials. This method is hereinafter referred to as a CCM method. The last one is a method of obtaining the primary three colors of light by transmitting white light from a white organic light emitting device used as a light emission source through color filters (CF) that are used in liquid crystal display devices or the like. This method is hereinafter referred to as a CF method.

The separate formation method is most efficient in taking out emitted light since the method does not suffer light loss in light conversion layers of the CCM method (the conversion efficiency hardly reaches 100%), or light absorption by color filters in the CF method. The separate formation method is an appealing method in this aspect, for the method allows a display device to fully benefit from the characteristics of self-luminous organic light emitting devices.

However, the separate formation methods also have some problems. For example, the shadow mask used in this method finds difficulties in dealing with a pixel that is smaller in size. Furthermore, the mask has to change locations every time the manufacture proceeds from formation of an organic light emitting device for one color to formation of an organic light emitting device for another color. The operation of changing locations of the mask is rather onerous and leads to unsatisfactory productivity.

A more serious problem of the separate formation method is that, at present, characteristics (light emission efficiency and lifetime) vary between a red light emitting device, a green light emitting device, and a blue light emitting device.

As to the light emission efficiency, for example, the lowest required efficiency (equals to power efficiency, the unit thereof is 1 m/W) is proposed for each of the primary three colors of light in full color display (Reference 2: Yoshiharu Sato, "Journal of Organic Molecules and Bioelectronics Division of The Japan Society of Applied Physics", vol. 11, no. 1, 86-99 (2000)). According to Reference 2, there are many reports in which a green light emitting device and a blue light emitting device exhibit light emission efficiency exceeding their respective required values. On the other hand, the light emission efficiency of red light emitting device falls far below its required value. Accordingly, under the present circumstances, low light emission efficiency of red light emitting device is the stumbling block to a full color display device by the separate formation method.

As to the lifetime (lowering of luminance with time), it is rare that the lifetime of an organic light emitting device of one color exactly coincides with the lifetime of an organic light emitting device of another color. This means that the color balance among the primary three colors of light could be lost with time resulting in inaccurate coloring and irregular luminance, which are fatal defects as a display.

On the other hand, a merit of the CCM method and the CF method is that the methods do not have the fatal problems of the separate formation method as described above despite their rather inferior efficiency in taking out emitted light due to slight loss or absorption of light.

The CCM method or the CF method does not need the minute operation for separately forming organic light emitting devices of different colors using a shadow mask since an organic light emitting device of a single color (blue in the case of the CCM method, white in the case of the CF method) are used. Also, a color conversion layer and a color filter can be formed by a conventional photolithography technique and no complicate process is necessary. Moreover, the CCM method and the CF method are free from inaccurate coloring and irregular luminance over time because only one type of organic light emitting device is used to cause the luminance to change uniformly with time.

From the above, the CCM method and the CF method can be very effective methods in manufacturing a full color display device if it is possible to obtain a blue or white organic light emitting device that has higher luminance and longer lifetime.

However, blue organic light emitting devices and white organic light emitting devices have several problems. First, shortness of lifetime can be given as a problem common to the two.

Blue organic light emitting devices have made an exponential advance in recent years as a result of development of a distyryl arylene-based blue light emitting material. The material makes it possible for the luminance to achieve a half-life of 20 thousand hours when the initial luminance is set to 100 $cd/m^2$ and the device is driven with a constant current (Reference 3: Masatoshi Aketagawa, "Monthly Display, October 1998, Special Issue on Organic EL Display, 100-104").

Despite this advancement, a blue light organic light emitting device needs to emit blue light with even higher luminance in order to obtain bright green light and red light in realizing a full color display using the CCM method (because of loss by a color conversion layer). The lifetime of an organic light emitting device becomes shorter as the device emits light at higher luminance. Therefore, when the CCM method is used, the lifetime has to be even longer. For example, green organic light emitting devices that have the longest lifetime can last fifty thousand hours if the conditions are the same, and blue organic light emitting devices are desired to achieve lifetime of this long.

The problem of short lifetime is more serious for white organic light emitting devices. A report says that, except one sample, the half-life of the luminance of white organic light emitting devices formed from low molecular weight materials is on the order of several tens hours when the initial luminance is set to 100 $cd/m^2$ and the devices are driven with a constant current (Reference 4: Yasuhisa Kishikami, "Monthly Display", September 2000, 20-25).

Low light emission efficiency is another problem of white organic light emitting devices. In the CF method where white organic light emitting devices are combined with color filters, the light emission efficiency is fatally low since a large portion of emitted light is absorbed by the color filters. High light emission efficiency is desired also in the CCM method where blue organic light emitting devices are used since loss of light is caused due to color conversion layers.

SUMMARY OF THE INVETION

The present invention has been made in view of the above, and an object of the present invention is therefore to provide a blue or white organic light emitting device with high light emission efficiency and long lifetime. Another object of the present invention is to provide a full color display device which has higher efficiency, longer lifetime, and better productivity than conventional ones by combining the above organic light emitting device with the CCM method or the CF method.

Still another object of the present invention is to provide a low cost electric appliance that consumes less power and lasts longer than conventional ones by manufacturing the electric appliance using the above display device.

In the organic light emitting device disclosed in Reference 1, basically, the carrier injection barrier against the organic compound film is lowered by using for the cathode a Mg:Ag alloy that has low work function and is relatively stable, so that more electrons are injected. This makes it possible to inject a large number of carriers into the organic compound film.

Further, a single hetero structure, in which a hole transporting layer formed of an aromatic diamine compound and an electron transporting light emitting layer formed of tris (8-quinolinolate)—aluminum (hereinafter referred to as Alq) are layered as the organic compound film, is adopted to improve the carrier recombination efficiency exponentially. This is explained as follows.

In the case of an organic light emitting device in which organic compound film consists of only a single layer of Alq, for example, most of electrons injected from the cathode reach the anode without being recombined with holes because Alq is capable of transporting electrons. Therefore the light emission efficiency is very low. In short, a material that can transport electrons and holes both in balanced amounts (hereinafter referred to as bipolar material) has to be used in order that a single layer organic light emitting device can emit light efficiently (i.e., in order to drive the device at a low voltage), and Alq does not meet the requirement.

On the other hand, when the single hetero structure as Reference 1 is adopted, electrons injected from the cathode are blocked at the interface between the hole transporting layer and the electron transporting light emitting layer and trapped in the electron transporting light emitting layer. Recombination of the carriers thus takes place in the electron transporting light emitting layer with high efficiency, resulting in efficient light emission.

It can be said that the organic light emitting device in Reference 1 is characterized by separation of functions of the hole transporting layer and the electron transporting light emitting layer in which the former layer is assigned to transport holes and the latter layer is assigned to transport electrons and emit light. An advantage of this separation of functions is an increased degree of freedom in molecule design and the like as the separation of functions saves one organic material from bearing various functions (such as light emission, carrier transportation, and injection of carriers from electrodes) simultaneously (for instance, the separation of functions makes it unnecessary to search a suitable bipolar material). In other words, high light emission efficiency can easily be obtained by simply combining a material excellent in a light emission characteristic with a material excellent in a carrier transportation ability.

Applications of similar laminate structures are employed for conventional blue organic light emitting devices and white organic light emitting devices. For example, the basic structure of blue organic light emitting devices is a double hetero structure in which a light emitting layer is sandwiched between a hole transporting layer and an electron transporting layer as shown in Reference 3. White organic light emitting devices often use a laminate structure that has a blocking layer, except for the case in which pigment is dispersed in a single layer of a high molecular weight material. In other words, the laminate structure with a blocking layer is employed when a low molecular weight material is used (Reference 5: Junji Kido, Masato Kimura, Katsutoshi Nagai, "Multilayer White Light-Emitting Organic Electroluminescent Device", Science, vol. 267, no. 3, 1332-1334 (1995)). A blocking layer means a layer formed of a material that has a large difference in energy between the highest occupied molecular orbital (HOMO) and the lowest unoccupied molecular orbital (LUMO) (hereinafter referred to as excitation energy level) and that has a function of preventing transmission of holes or electrons and of preventing diffusion of molecular exciton.

However, the laminate structures described in the above are formed by joining between different substances and therefore an interface (hereinafter referred to as organic interface) is formed between the respective layers. One of problems caused by forming an organic interface is an influence on the lifetime of the organic light emitting device. In other words, the luminance is lowered by inhibition of carrier movement and the resultant accumulation of charges in the organic interface.

Although there is no clear theory that explains the mechanism of this degradation, a report says that lowering of luminance can be limited by inserting a hole injection layer between an anode and a hole transporting layer and by ac driving at square wave instead of dc driving (Reference 6: S. A. VanSlyke, C. H. Chen, and C. W. Tang, "Organic electroluminescent devices with improved stability", Applied Physics Letters, vol. 69, no. 15, 2160-2162 (1996)). This is experimental verification to the idea that lowering of luminance can be limited by avoiding accumulation of charges through insertion of a hole injection layer and ac driving.

When movement of carriers is blocked at an organic interface, a drive voltage could be raised that much. Solving this problem is significant also from the view point of light emission efficiency because lowering of the drive voltage can lead to improvement of light emission efficiency.

In order to overcome the problem, it is important to consider causes for blocking of carrier movement at an organic interface and improve the causes. As a model of blocking of carrier movement by forming an organic interface, the present inventors have thought of the following two mechanisms.

One mechanism involves morphology of organic interfaces. An organic compound film in an organic light emitting device is usually an amorphous film, which is formed from organic compound molecules aggregated by intermolecular forces, mainly, dipole interaction. When a hetero structure is built using such aggregation of molecules, differences in size and shape of molecules could greatly influence interfaces (namely, organic interfaces) of the hetero structure.

In particular, if the hetero structure is built using materials that have large difference in molecule size, the conformance in joining in organic interfaces can be poor. A conceptual diagram thereof is shown in FIG. 1. In FIG. 1, a first layer 111 consisting of small molecules 101 and a second layer 112 consisting of large molecules 102 are layered. In this case, poor conformance regions 114 are formed at an organic interface 113 between the layers 111 and 112.

The poor conformance regions 114 shown in FIG. 1 could act as a barrier (or energy barrier) that blocks movement of carriers and therefore could be an opposition to reduction of the drive voltage. The light emission efficiency could be lowered as a result. Carriers that cannot go beyond the energy barrier accumulate as charges and can induce lowering of luminance as described above.

The other mechanism involves the process of building the hetero structure (i.e., forming organic interfaces). An organic light emitting device with a hetero structure is usually manufactured by multi-chamber type (in-line type) evaporation apparatus as the one shown in FIG. 2 in order to avoid contamination in forming the respective layers.

The example shown in FIG. 2 as a conceptual diagram is evaporation apparatus for forming a double hetero structure that is composed of a hole transporting layer, a light emitting layer, and an electron transporting layer. First, a substrate which has an anode (formed of, e.g., indium tin oxide (hereinafter referred to as ITO)) is brought into a loading chamber. The substrate is irradiated with ultraviolet rays in a vacuum atmosphere in an ultraviolet ray irradiation chamber to clean the anode surface. When the anode is an oxide such as ITO in particular, oxidization treatment is conducted in a pretreatment chamber. Then the layers of the laminate structure are formed. The hole transporting layer is formed in an evaporation chamber 201, the light emitting layer (red, green, and blue layers in FIG. 2) is formed in evaporation chambers 202 to 204, and the electron transporting layer is formed in an evaporation chamber 205. A cathode is formed by evaporation in an evaporation chamber 206. Lastly, sealing is conducted in a sealing chamber and the substrate is taken out of an unloading chamber to obtain the organic light emitting device. Reference symbols 215 to 216 denote evaporation sources.

The in-line type evaporation apparatus as this is characterized in that different layers are formed by evaporation in different chambers 201 to 206. In other words, the apparatus is structured so that mixing of materials of the respective layers is avoided almost completely.

Although the pressure in the interior of the evaporation apparatus is usually reduced to $10^{-4}$ to $10^{-5}$ pascal, there are minute amounts of gas components (such as oxygen and water vapor). It is said that, with the vacuum with this degree, these minute amounts of gas components readily form a monomolecular adsorption layer within a few seconds.

Accordingly, when the organic light emitting device with the laminate structure is manufactured using the apparatus as FIG. 2, the problem is a large interval between formation of one layer and formation of another layer. To elaborate, an undesirable adsorption layer due to a minute amount of gas component (hereinafter referred to as impurity layer) might be formed in an interval between forming layers, especially when the substrate is transferred through a second transferring chamber.

A conceptual diagram thereof is shown in FIG. 3. In FIG. 3, an impurity layer 313 is being formed from a minute amount of impurity 303 (such as water vapor or oxygen) between a first layer 311 formed of a first organic compound 301 and a second layer 312 formed of a second organic compound 302 when the second layer is laid on the first layer.

When impurity layers are formed between the layers (namely in organic interfaces) in this way, they serve as impurity regions that trap carriers after the organic light emitting device is completed, thereby blocking movement of the carriers. Accordingly, the drive voltage may be raised to lower the light emission efficiency. Furthermore, the presence of impurity regions that trap carriers leads to accumulation of charges, and therefore lowering of luminance as described above could be induced.

In order to solve the above problems that takes place in organic interfaces (degraded morphology of the organic interface and formation of impurity layers), the present inventors have devised a joining structure as shown in FIG. 4.

FIG. 4 is a sectional view of an organic compound film composed of a region 411, a region 412, and a mixed region 413. The region 411 consists of small molecules 401. The region 412 consists of large molecules 402. The mixed region 413 contain both the small molecules 401 and large molecules 402. As is apparent from FIG. 4, there is no organic interface 113 present in FIG. 1, nor poor conformance regions 114. The problem of degraded morphology of the organic interface thus can be solved.

How the problem of formation of impurity layers is solved is simple and obvious. When the joining structure as FIG. 4 is manufactured, the region 411 of the small molecules 401 is formed by evaporation, and the large molecules 402 are additionally deposited by coevaporation to form the mixed region 413. After the mixed region 413 is completed, deposition of the small molecules 401 by evaporation is stopped and only deposition of the large molecules 402 by evaporation is continued. This creates a situation in which one or two materials are continuously deposited by evaporation without forming organic interfaces. Accordingly, there is no interval that is usually present in manufacturing an organic light emitting device using the evaporation apparatus as the one in FIG. 2. In short, there is no time allowed to form impurity layers.

By employing such joining structure, no organic interface is formed and therefore movement of carriers is smooth and the light emission efficiency and lifetime of the organic light emitting device are not affected. Further, separation of functions is secured as in the conventional laminate structures.

In contrast to the conventional laminate structure that is a simple joining of different substances (hetero junction), the joining structure of the present invention is what can be called a mixed junction which can provide an organic light emitting device based on a novel concept.

Then, adopting this idea, the present inventors have further devised measures to obtain a blue or white organic light emitting device in which organic interfaces of a laminate structure are substantially removed and at the same time the layers separately exhibit functions of transporting carriers and of emitting light.

FIGS. 5A and 5B are conceptual diagrams of blue organic light emitting devices obtained by introducing the mixed junction to the double hetero structure. Although an anode 501 is placed on a substrate 500 here, the structure may be reversed to place a cathode 503 on the substrate. Denoted by 502 is an organic compound film.

The device in FIG. 5A has a hole transporting region 504 formed of a hole transporting material, a light emitting region 505 formed of a blue light emitting material, and an electron transporting region 506 formed of an electron transporting material. As a characteristic of the present invention, the device is further provided with a first mixed region 507 in which the hole transporting material and the blue light emitting material are mixed and a second mixed region 508 in which the electron transporting material and the blue light emitting material are mixed.

The device in FIG. 5B has a hole transporting region 514 formed of a hole transporting material, a light emitting region 515 obtained by doping a blue light emitting material 519 to a host material, and an electron transporting region 516 formed of an electron transporting material. As a characteristic of the present invention, the device is further provided with a first mixed region 517 in which the hole transporting material and the host material are mixed and a second mixed region 518 in which the electron transporting material and the host material are mixed.

FIGS. 6A and 6B are conceptual diagrams of white organic light emitting devices obtained by introducing the mixed junction to the double hetero structure. Although an anode 501 is placed on a substrate 500 here, the structure may be reversed to place a cathode 503 on the substrate. Denoted by 502 is an organic compound film.

The device in FIG. 6A has a hole transporting region 504 formed of a hole transporting material, a light emitting region 505 formed of a blue light emitting material, and an electron transporting region 506 formed of an electron transporting material. As a characteristic of the present invention, the device is further provided with a first mixed region 507 in which the hole transporting material and the blue light emitting material are mixed and a second mixed region 508 in which the electron transporting material and the blue light emitting material are mixed. In order to make the device emit white light, the region 505 formed of the blue light emitting material is doped with a second light emitting material 601 that emits light with longer wavelength than blue light. Preferable color of light emitted from the second light emitting material 601 is substantially yellow to orange.

Desirably, the region 505 formed of the blue light emitting material is partially doped with the second light emitting material 601 instead of entirely doping. This is because blue light from the blue light emitting material also has to be taken out in order to obtain white light.

It is an alternative to FIG. 6A to dope the mixed region 507 or 508 with the second light emitting material 601. As an example thereof, FIG. 6B shows a device in which the first mixed region 507 is doped with the second light emitting material.

A white organic light emitting device, in which the mixed junction is introduced to the double hetero structure, may use a second light emitting material and a third light emitting material as dopants in addition to a blue light emitting material. The second light emitting material emits light with longer wavelength than blue light and the third light emitting material emits light with longer wavelength than the light emitted from the second light emitting material. Considering the primary three colors of light, it is preferable for the second light emitting material and the third light emitting material to emit green light and red light, respectively.

In this case, the second light emitting material and the third light emitting material are desirably used to dope different mixed regions (namely, the first mixed region is doped with one whereas the second mixed region is doped with the other). In an example shown in FIG. 7, a first mixed region 507 is doped with a second light emitting material 701 and a second mixed region 508 is doped with a third light emitting material 702.

The description up to this point deals with device structures obtained by introducing the mixed junction to the double hetero structure. Described next are device structures obtained by introducing the mixed junction to the single hetero structure. FIGS. 8A and 8B are conceptual diagrams of blue organic light emitting devices obtained by introducing the mixed junction to the single hetero structure. Although an anode 801 is placed on a substrate 800 here, the structure may be reversed to place a cathode 803 on the substrate. Denoted by 802 is an organic compound film.

The device in FIG. 8A has a hole transporting region 804 formed of a hole transporting material, and an electron transporting region 805 formed of an electron transporting material. As a characteristic of the present invention, the device is further provided with a mixed region 806 in which the hole transporting material and the electron transporting material are mixed. The hole transporting material or the electron transporting material emits blue light.

The device in FIG. 8B has a hole transporting region 804 formed of a hole transporting material and an electron transporting region 805 formed of an electron transporting material. As a characteristic of the present invention, the device is further provided with a mixed region 806 in which the hole transporting material and the electron transporting material are mixed. The mixed region 806 is doped with a blue light emitting material 807.

FIGS. 9A and 9B are conceptual diagrams of white organic light emitting devices obtained by introducing the mixed junction to the single hetero structure. Although an anode 801 is placed on a substrate 800 here, the structure may be reversed to place a cathode 803 on the substrate. Denoted by 802 is an organic compound film.

The device in FIG. 9A has a hole transporting region 804 formed of a hole transporting material and an electron transporting region 805 formed of an electron transporting material. As a characteristic of the present invention, the device is further provided with a mixed region 806 in which the hole transporting material and the electron transporting material are mixed. The hole transporting material or the electron transporting material emits blue light. In order to make the device emit white light, the mixed region 806 is doped with a second light emitting material 901 that emits light with longer wavelength than blue light. Preferable color of light emitted from the second light emitting material 901 is substantially yellow to orange.

Desirably, the mixed region 806 formed of the blue light emitting material is partially doped with the second light emitting material 901 instead of entirely doping. This is because blue light emitted from a blue light emitting material also has to be taken out in order to obtain white light.

It is an alternative to FIG. 9A to dope the hole transporting region 804 or the electron transporting region 805 with the second light emitting material 901. As an example thereof, FIG. 9B shows a device in which the electron transporting region 805 is doped with the second light emitting material.

A white organic light emitting device obtained by introducing the mixed junction may use a second light emitting material and a third light emitting material as dopants in addition to a blue light emitting material. The second light emitting material emits light with longer wavelength than blue light and the third light emitting material emits light with longer wavelength than the light emitted from the second light emitting material. Considering the primary three colors of light, it is preferable for the second light emitting material and the third light emitting material to emit green light and red light, respectively.

In this case, the second light emitting material and the third light emitting material are desirably used to dope different carrier transporting regions (namely, the hole transporting region is doped with one whereas the electron transporting region is doped with the other). In an example shown in FIG. 10, a hole transporting region 804 is doped with a second light emitting material 1001 and an electron transporting region 805 is doped with a third light emitting material 1002.

Though not shown in any of FIGS. 5A to 10, a hole injection region formed of a material for promoting injection of holes (hereinafter referred to as hole injection material) may be inserted between an anode and an organic compound film. Also, an electron injection region formed of a material for promoting injection of electrons (hereinafter referred to as electron injection material) may be inserted between a cathode and an organic compound film.

The hole injection material and the electron injection material are capable of lowering the barrier in injecting carriers from electrodes to an organic compound film. Accordingly, the hole injection region and the electron injection region have an effect of making movement of carriers from the electrodes to the organic compound film smooth to prevent accumulation of charges. In order to avoid forming the impurity layer as described above, an injection material is formed into a film before or after an organic compound film with no interval.

The above blue or white organic light emitting devices can achieve high light emission efficiency and long lifetime. Therefore, by combining such organic light emitting devices with the CCM method or the CF method, a full color display device can be obtained which has higher light emission efficiency, longer lifetime, and better productivity than conventional display devices.

BRIEF DESCRIPTION OF THE DRAWINGS

In the accompanying drawings:

FIGS. 13A and 13B are diagrams showing sectional structures of display devices;

FIGS. 15A and 15B are diagrams respectively showing a top structure of a display device and a sectional structure thereof;

FIGS. 20A to 20C are diagrams showing the structure of a display device;

DETAILED DESCRIPTION OF THE PREFERRED EMBODIMENTS

Modes of carrying out the present invention will be described below. Generally, it is sufficient if either an anode or a cathode of an organic light emitting device is transparent to take emitted light out. In an organic light emitting device of this embodiment mode, a transparent anode is formed on a substrate to take out light through the anode. However, the present invention is also applicable to other structures and a transparent cathode may be formed on a substrate to take out light through the cathode or light may be taken out from the opposite side of the substrate.

In carrying out the present invention, the process of manufacturing an organic light emitting device has to be designed to avoid formation of impurity layers. Therefore a method of manufacturing an organic light emitting device according to the present invention is described first.

Figure 11A:
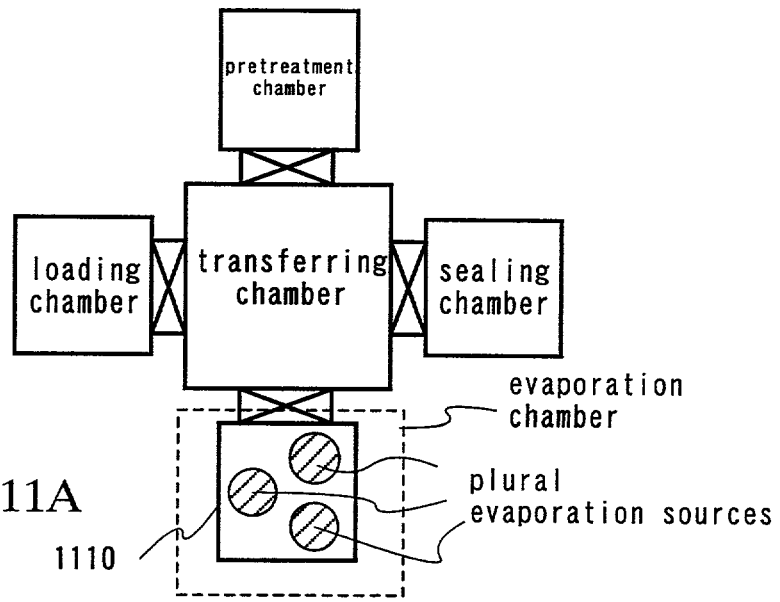
FIGS. 11A and 11B are diagrams showing evaporation apparatus.

FIG. 11A is a top view of evaporation apparatus. The apparatus is of a single chamber type in which one vacuum tank 1110 is set as an evaporation chamber and a plurality of evaporation sources are provided in the vacuum tank. Stored in the plural evaporation sources respectively are materials with different functions, such as a hole injection material, a hole transporting material, an electron transporting material, an electron injection material, a blocking material, a light emitting material, and a material for forming a cathode.

In the evaporation apparatus which has such evaporation chamber, a substrate having an anode (formed of ITO or the like) is brought into a loading chamber. If the anode is an oxide such as ITO, oxidation treatment is performed in a pretreatment chamber (although not shown in FIG. 11A, the apparatus may be provided with an ultraviolet ray irradiation chamber to clean the anode surface). All of the materials that form the organic light emitting device are subjected to evaporation in the vacuum tank 1110. The cathode can be formed in the vacuum tank 1110, or may be formed in a separate evaporation chamber instead. In short, it is sufficient if layers preceding the cathode are formed in the one vacuum tank 1110 by evaporation. Lastly, sealing is conducted in a sealing chamber and the substrate is taken out of an unloading chamber to obtain the organic light emitting device.

The procedure of manufacturing an organic light emitting device of the present invention using the single chamber type evaporation apparatus as this will be described with reference to FIG. 11B (a sectional view of the vacuum tank 1110). Shown in FIG. 11B as a simple example is a process of forming an organic compound film (the organic compound film 502 shown in FIG. 5A) that contains a hole transporting material 1121, an electron transporting material 1122, and a blue light emitting material 1123 using the vacuum chamber 1110 that has three evaporation sources (an organic compound evaporation source a 1116, an organic compound evaporation source b 1117, and an organic compound evaporation source c 1118).

First, a substrate 1101 having an anode 1102 is brought into the vacuum tank 1110 and is fixed by a fixing base 1111 (usually, the substrate is rotated during evaporation). Next, the pressure in the vacuum tank 1110 is reduced (preferably to $10^{-4}$ pascal or lower) and then a container a 1112 is heated to vaporize the hole transporting material 1121. When a given evaporation rate (unit: Å/s) is reached, a shutter a 1114 is opened to start evaporation.

Figure 11B:
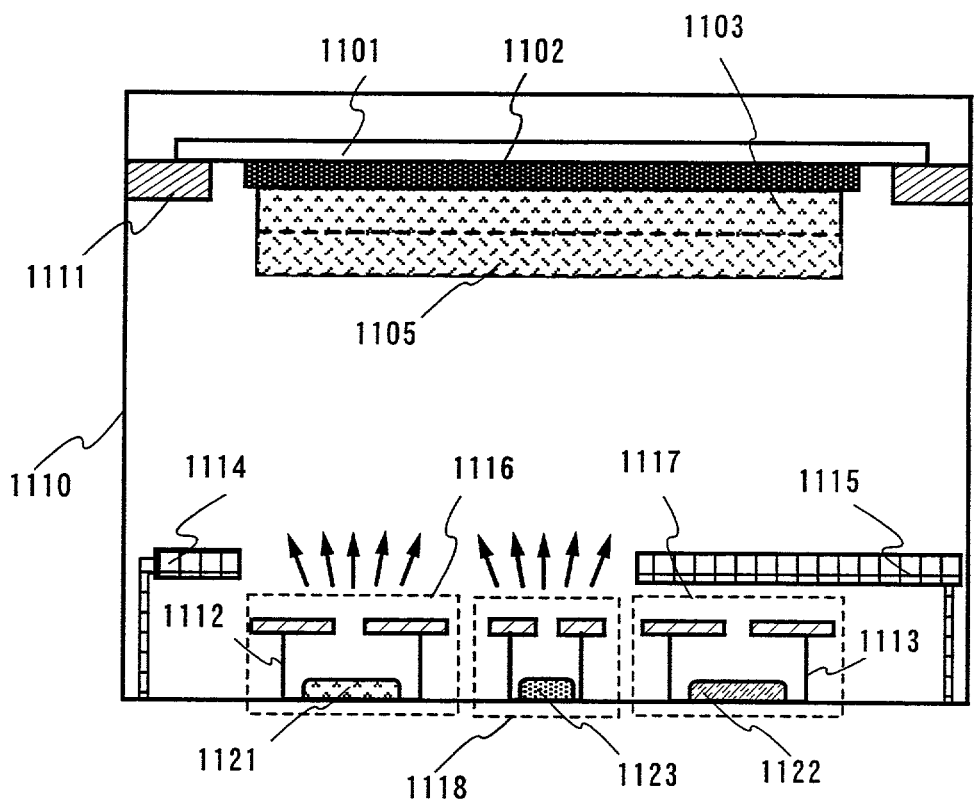

After a hole transporting region 1103 reaches to a given thickness, evaporation of the blue light emitting material 1123 is started while the hole transporting material 1121 is kept evaporated to form a first mixed region 1105 (corresponding to the state shown in FIG. 11B). Then the shutter a 1114 is closed completely to end evaporation of the hole transporting material 1121 and form a light emitting region consisting of the blue light emitting material 1123. At this point, a container b 1113 is heated with a shutter b 1115 closed.

After the light emitting region reaches to a given thickness, the shutter b 1115 is opened and evaporation of the electron transporting material 1122 is started to form a second mixed region. Lastly, evaporation of the blue light emitting material 1123 is ended and an electron transporting region consisting of the electron transporting material 1122 is formed. All of the above operations are successively conducted without any interval and therefore no impurity layers are formed in any of the regions.

Figure 24:
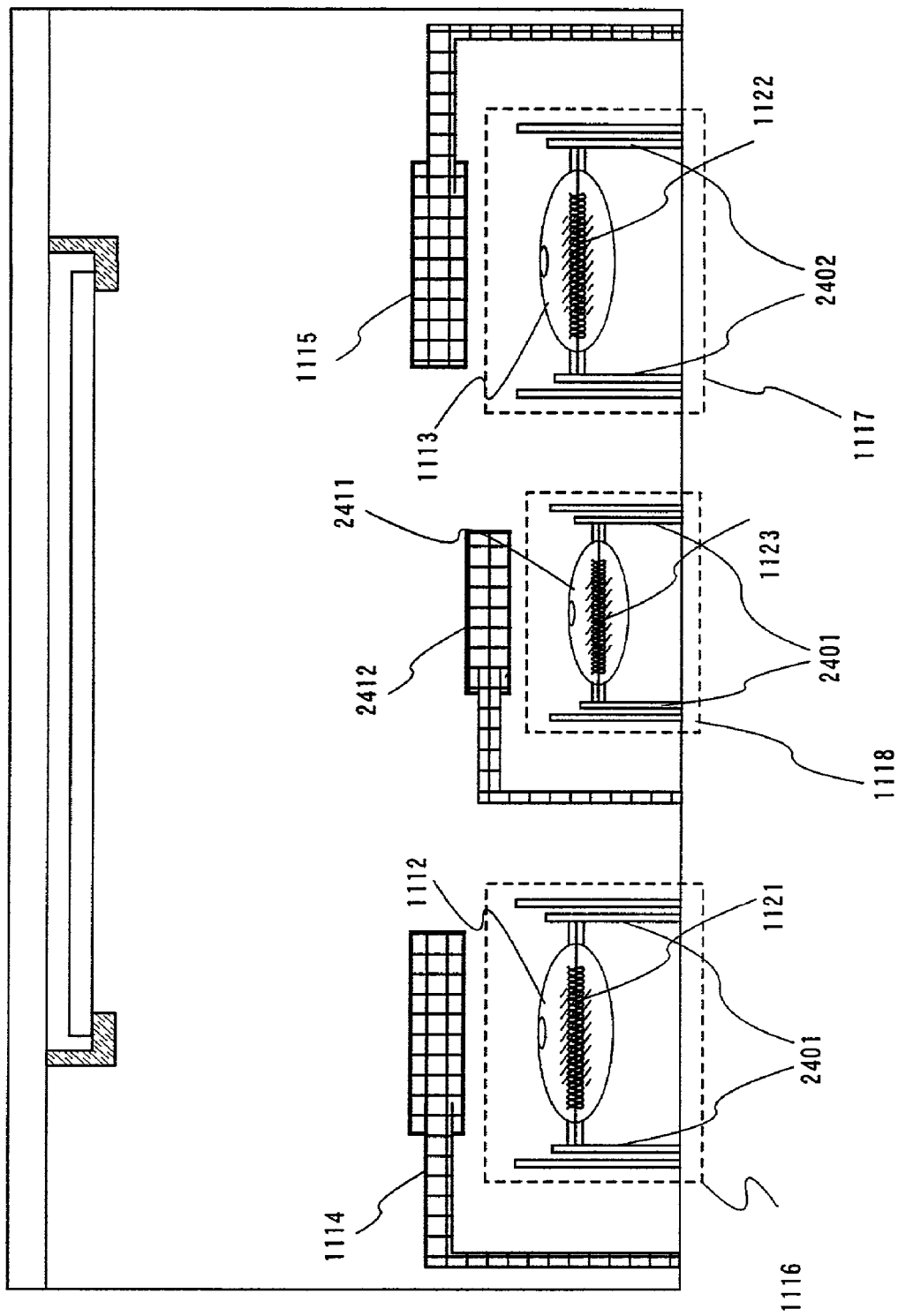
FIG. 24 is a diagram showing concrete organic compound evaporation sorces.

Concrete shapes of the organic compound evaporation source a 1116, the organic compound evaporation source b 1117, and the organic compound evaporation source c 1118 are shown in FIG. 24. There is a case in which a cell is used or a conductive heat generatoris used, and the case of using the conductive heat generator is shown in FIG. 24. In short, the container a 1112, the container b 1113, and a container c 2411 are formed of the conductive heat generator, and the container a 1112 containing the hole transporting material 1121, the container b 1113 containing the electron transporting material 1122, the container c 2411 containing the blue light emitting material are sandwiched by an electrode a 2401, an electrode b 2402, and an electrode c 2403, respectively. Then, the container a 1112, the container b 1113, and a container c 2411 are heated for evaporation by flowing current. A shutter c 2412 for the organic compound evaporation source c 1118 is also shown here.

All of the organic light emitting devices described in 'Summary of the Invention' can be manufactured by application of this method. For instance, in manufacturing a device as FIG. 5B which includes a blue light emitting material as a guest in relation to a host material, an evaporation source for evaporation of the host material may be added to the components of FIG. 11B. The host material is used for forming the mixed region and forming the light emitting region whereas the light emitting material is evaporated in a minute amount to dope the host material during evaporation of the host material (during formation of the light emitting region).

In the case where a hole injection region or an electron injection region is formed, an evaporation source for each of the injection materials is set in the same vacuum tank 1110. For example, if a hole injection region is formed by evaporation between the anode 1102 and the hole transporting region 1103 in FIG. 11B, the hole transporting material 1121 is evaporated immediately after the hole injection material is deposited by evaporation on the anode 1102 without any interval. Formation of impurity layers is thus avoided.

Listed below are materials preferable as the hole injection material, the hole transporting material, the electron transporting material, the electron injection material, and the light emitting material. However, materials usable for an organic light emitting device of the present invention are not limited thereto.

For the hole injection material, within confines of organic compounds, a phthalocyanine (hereafter, $H_2Pc$)-based compound, copper phthalocyanine (hereafter, CuPc), in particular, is often used. Among polymers, materials obtained by performing chemical doping on conjugate system conductive polymers may be used. Examples of these polymers include polyethylene dioxythiophene (hereafter, PEDOT) doped with polystyrene sulfonic acid (hereafter, PSS), and polyaniline, or polypyrrole, doped with iodine or other Lewis acid. A polymer that is an insulator is also effective in terms of planarization of the anode, and polyimide (hereafter, PI) is often used. Effective hole injection materials are also found among inorganic compounds, and examples thereof include a thin film of gold, platinum or like other metals and a very thin film of aluminum oxide (hereinafter referred to as alumina).

Materials most widely used as the hole transporting material are aromatic amine-based (namely, those having a benzene ring-nitrogen bond) compounds. Of them, particularly widely used are: 4,4'-bis (diphenylamino)-biphenyl (hereafter, TAD); its derivative, namely, 4,4'-bis [N-(3-methylphenyl)-N-phenyl-amino]-biphenyl(hereafter, TPD); and 4,4'-bis-[N-(1-naphthyl)-N-phenylamino]-biphenyl (hereafter, α-NPD). Also used are star burst aromatic amine compounds, including: 4,4',4''-tris (N,N-diphenyl-amino)-triphenyl amine (hereafter, TDATA); and 4,4',4''-tris [N-(3-methylphenyl)-N-phenyl-amino]-triphenyl amine (hereafter, MTDATA).

Metal complexes are often used as the electron transporting material. Examples thereof include: metal complexes having quinoline skeleton or benzoquinoline skeleton, such as the aforementioned Alq, tris (4-methyl-8-quinolinolate) aluminum (hereafter, Almq), and bis (10-hydroxybenzo [h]-quinolinate) beryllium (hereafter, Bebq); and bis (2-methyl-8-quinolinolate)-(4-hydroxy-biphenylil)-aluminum(hereafter, BAlq) that is a mixed ligand complex. The examples also include metal complexes having oxazole-based and thiazole-based ligands such as bis [2-(2hydroxypheyl)-benzooxazolate]zinc (hereafter, $Zn(BOX)_2$) and bis [2-(2-hydroxypheyl)-benzothiazolate] zinc (hereafter, $Zn(BTZ)_2$). Other materials that are capable of transporting electrons than the metal complexes are: oxadiazole derivatives such as 2-(4-biphenylyl)-5-(4-tert-butylphenyl)-1,3,4-oxadiazole (hereafter, PBD) and 1,3-bis [5-(p-tert-butylphenyl)-1,3,4-oxadiazole-2-il] benzene (hereafter, OXD-7); triazole derivatives such as 3-(4-terit-butylphenyl)-4-phenyl-5-(4-biphenylyl)—1,2,4-triazole (hereafter, TAZ) and 3-(4-tert-butylphenyl)-4-(4-ethylpheyl) -5-(4-biphenylyl)-1,2,4-triazole (hereafter, p-EtTAZ); and phenanthroline derivatives such as bathophenanthroline (hereafter, BPhen) and bathocuproin (hereafter, BCP).

The electron transporting materials given above can be used as the electron injection material. Other than those, a very thin film of an insulator, including alkaline metal halides such as lithium fluoride and alkaline metal oxides such as lithium oxide, is often used. Alkaline metal complexes such as lithium acetyl acetonate (hereafter, Li(acac)) and 8-quinolinolate-lithium (hereafter, Liq) are also effective.

Materials effective as the light emitting material are various fluorescent pigments, in addition to the aforementioned metal complexes including Alq, Almq, BeBq, BAlq, $Zn(BOX)_2$, and $Zn(BTZ)_2$. Examples of fluorescent pigments include 4,4'-bis (2,2,-diphenyl-vinyl)-biphenyl (hereafter, DPVBi) that is blue, and 4-(dicyanomethylene)-2-methyl-6-(p-dimethylaminostyryl)-4H-pyran (hereafter, DCM) that is reddish orange. Triplet light emission materials may also be used and the mainstream thereof are complexes with platinum or iridium as central metal. Known triplet light emission materials include tris (2-phenylpyridine) iridium (hereafter, $Ir(ppy)_3$) and 2,3,7,8,12,13,17,18-octaethyl-21H, 23H-porphyrin-platinum (hereafter, PtOEP).

The above materials with respective functions are combined to constitute an organic light emitting device of the present invention, whereby an organic light emitting device that has higher light emission efficiency and longer lifetime than conventional ones can be manufactured.

Figure 12A:
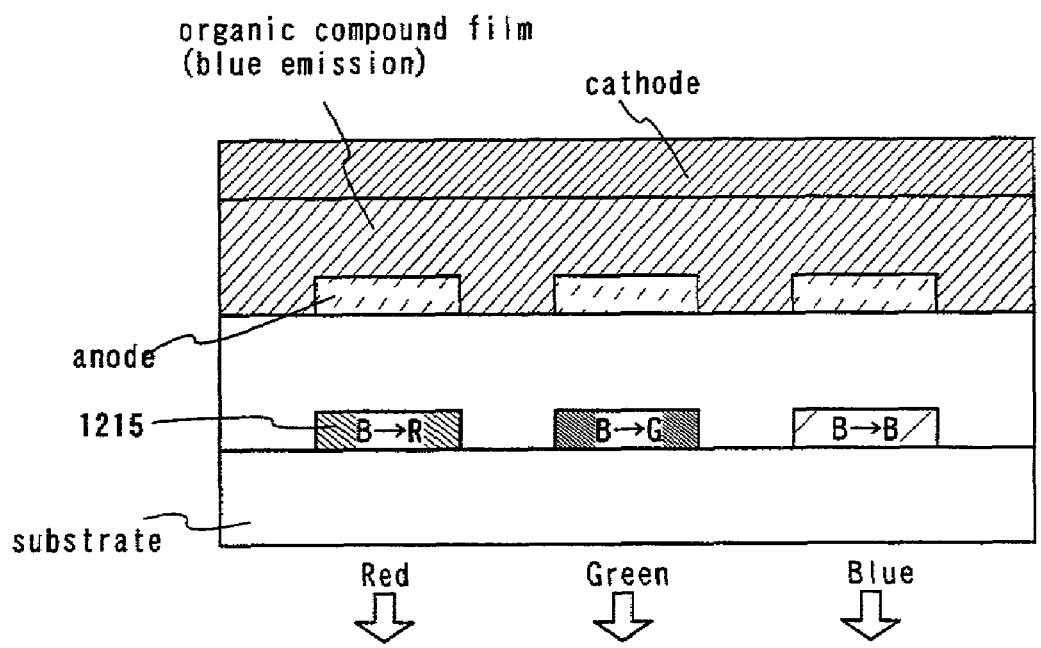
FIGS. 12A and 12B are schematic diagrams showing respectively a display device using color conversion layers and of a display device using color filters.
Figure 12B:
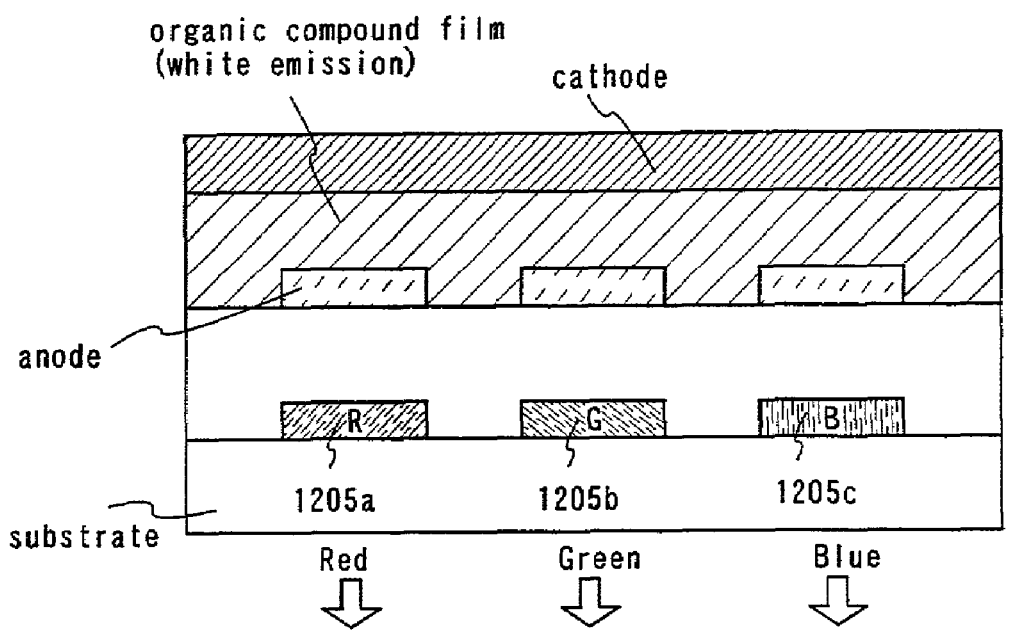

This organic light emitting device is used to make a full color display device and FIGS. 12A and 12B each shows the structure of the thus obtained display device schematically. FIG. 12A shows the CCM method in which a blue organic light emitting device is combined with color conversion layers. FIG. 12B shows the CF method in which a white organic light emitting device is combined with color filters. In FIG. 12A, the color conversion layer for B→B is not always necessary.

Conversion layers 1215 and color filters 1205a to 1205c can readily be patterned on substrates by the known technique of photolithography. Therefore the full color display devices are manufactured using this technique.

Embodiment 1

Figure 1:
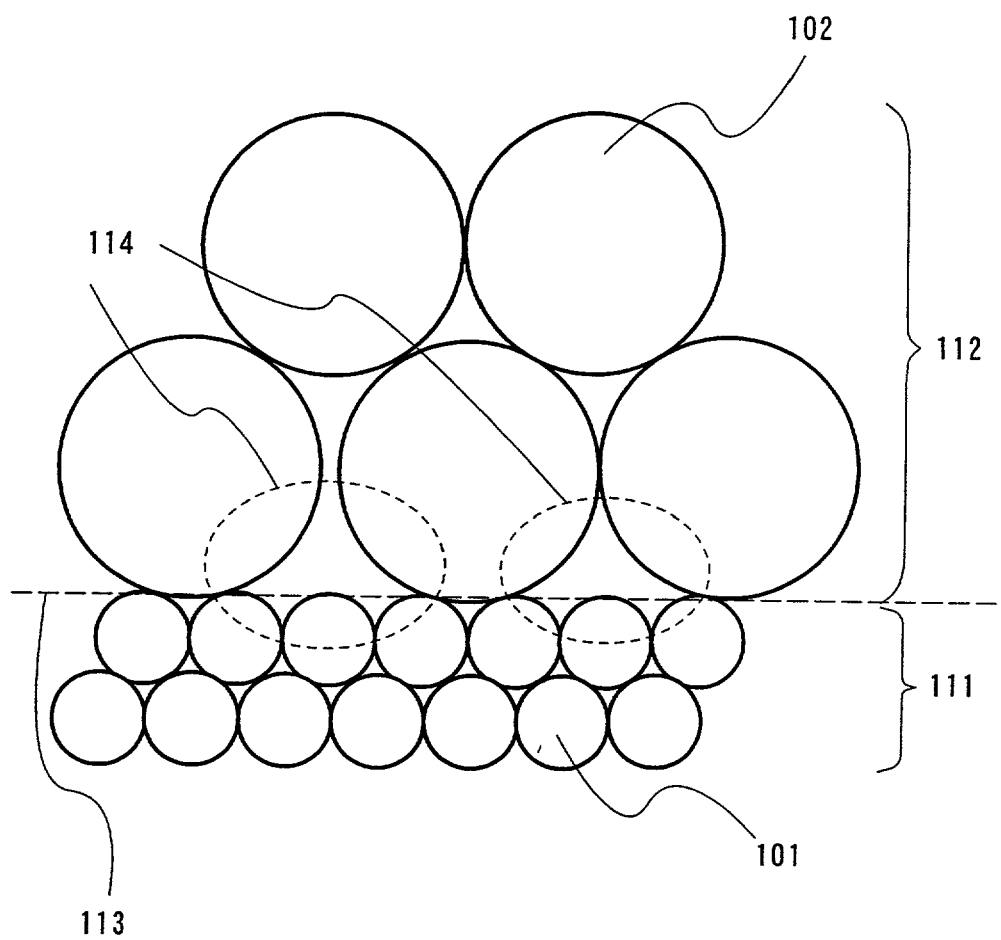
FIG. 1 is a diagram showing the state of an organic interface.
Figure 2:
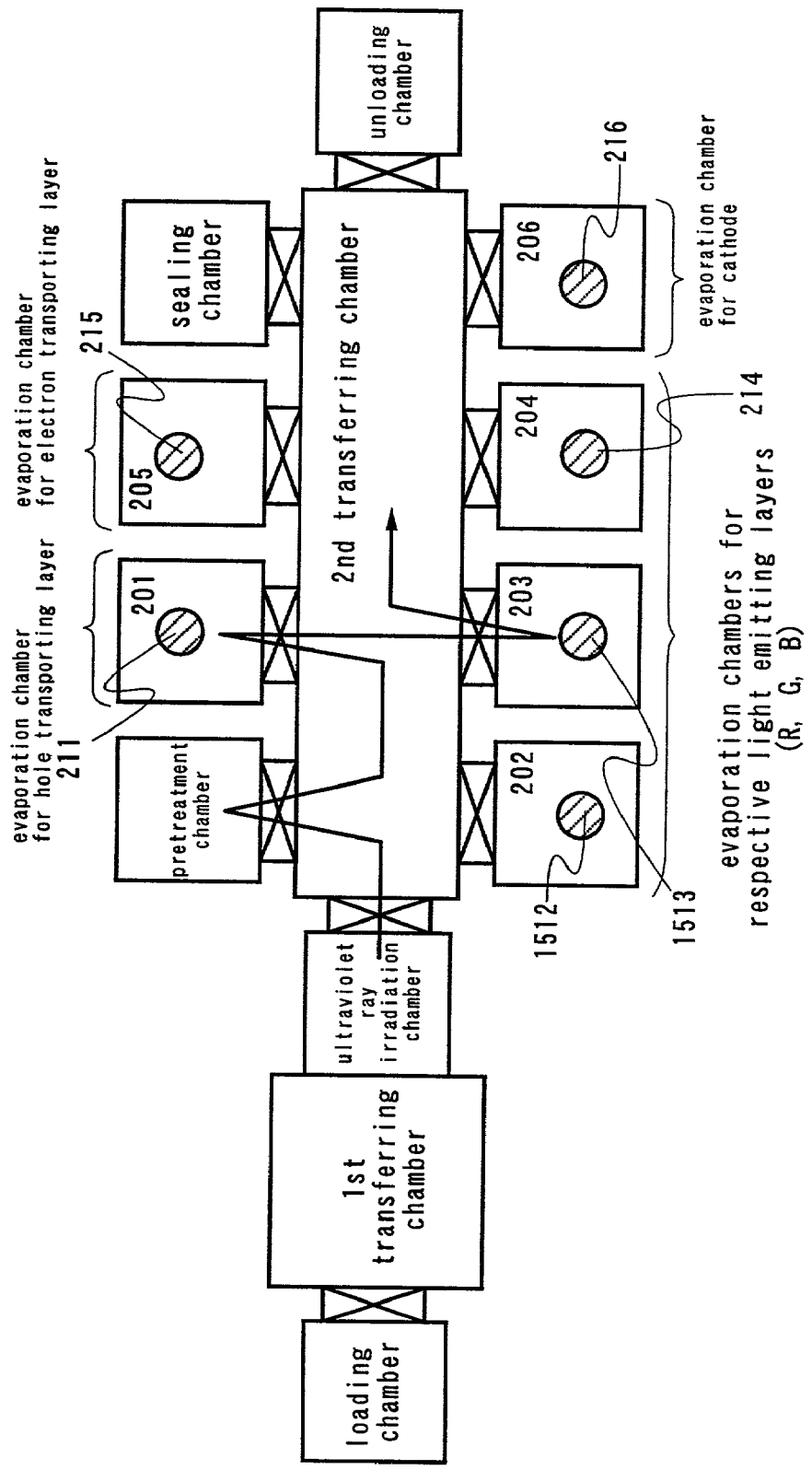
FIG. 2 is a diagram showing evaporation apparatus.
Figure 3:
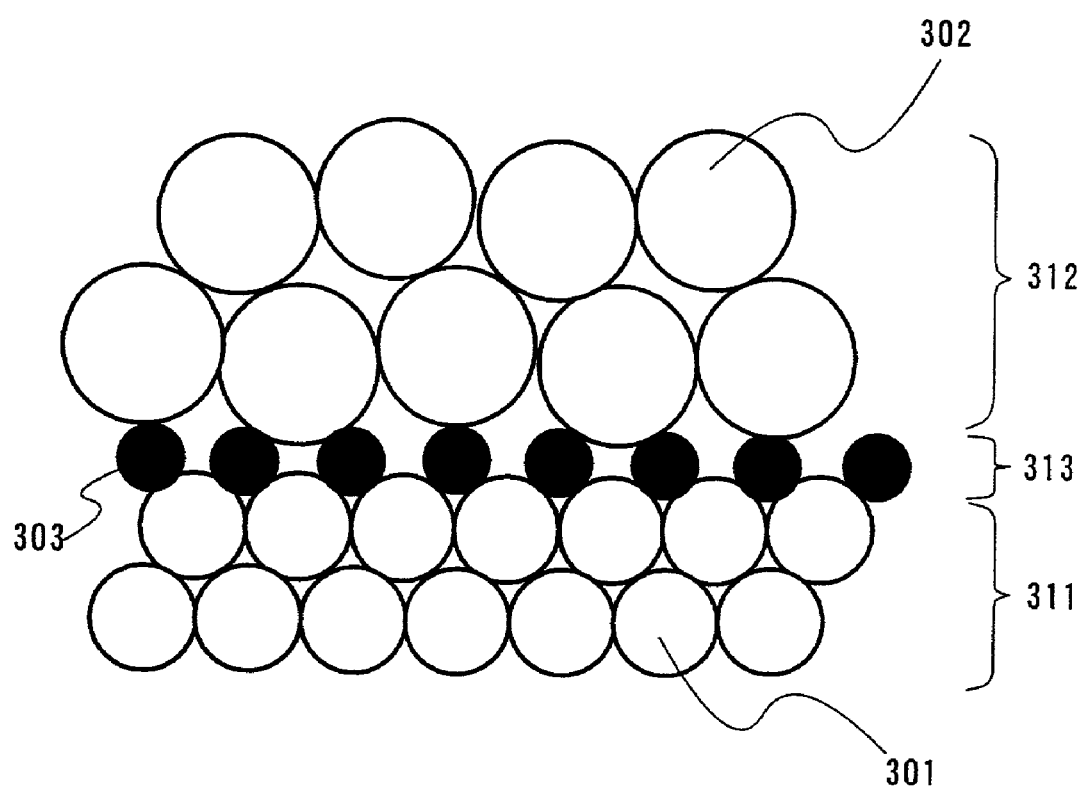
FIG. 3 is a diagram showing formation of an impurity layer.
Figure 4:
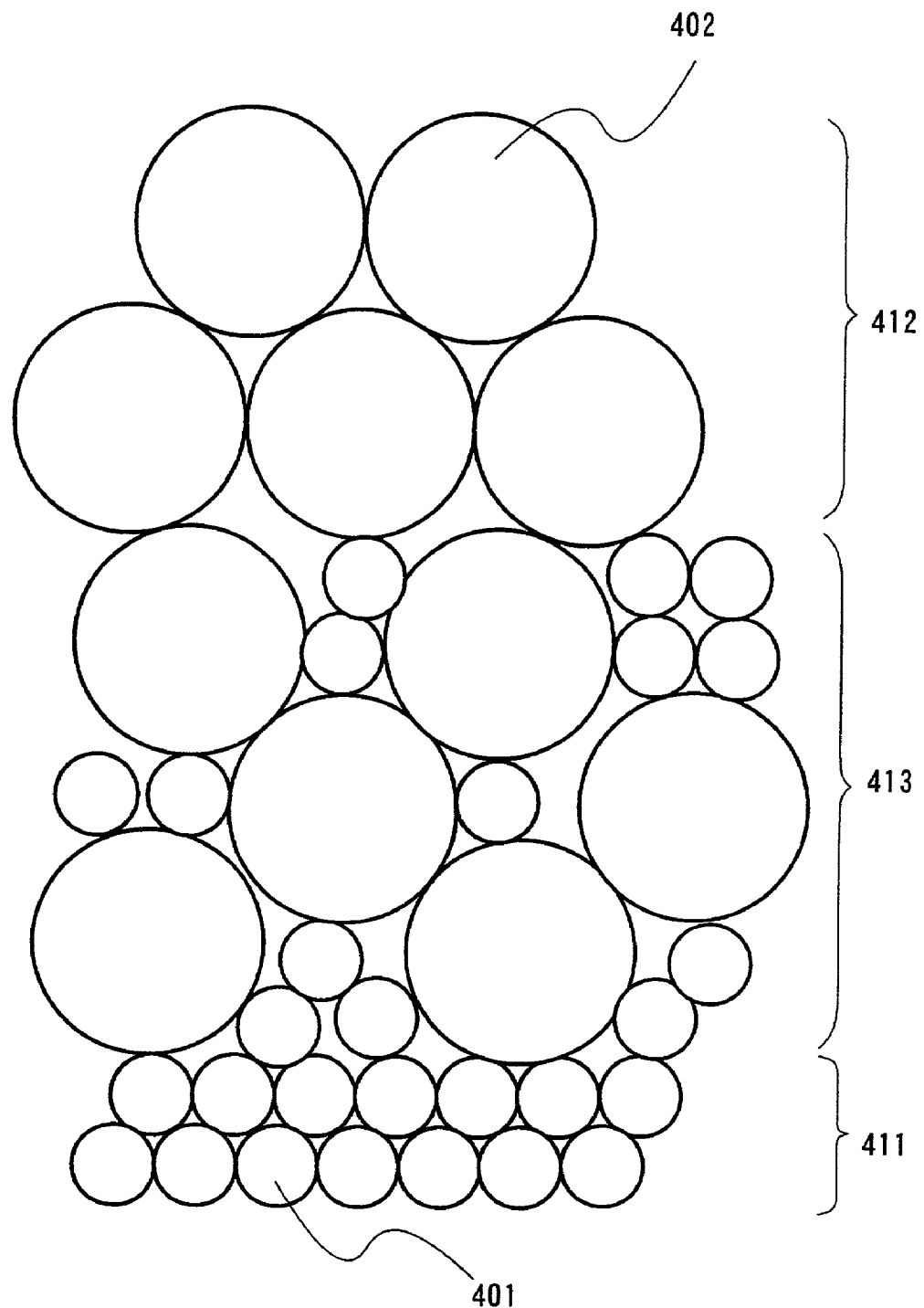
FIG. 4 is a diagram showing the state of a mixed region.
Figure 5A:
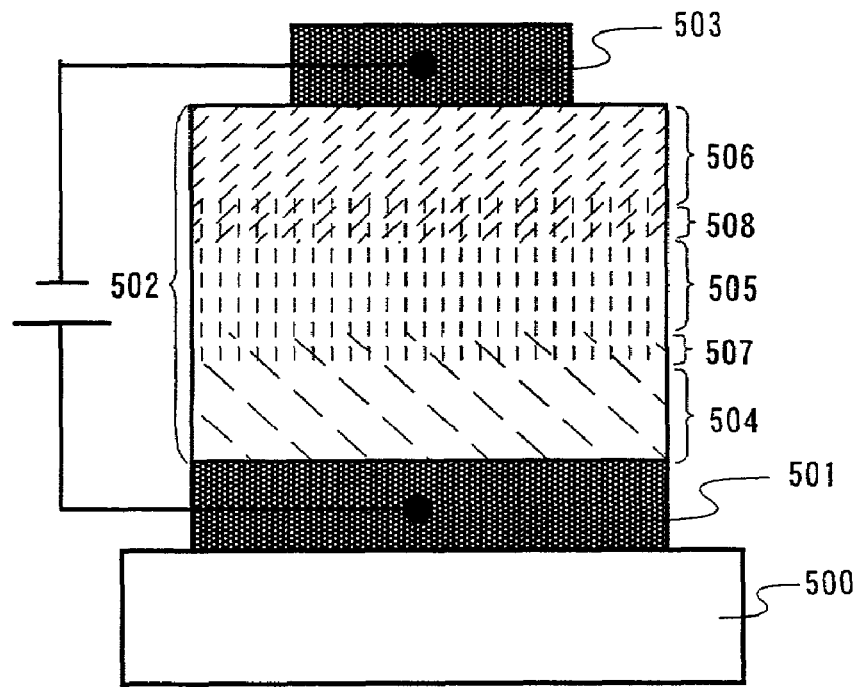
FIGS. 5A and 5B are diagrams showing structures of blue organic light emitting devices.

This embodiment shows a specific example of a device with a structure in which a hole injection region is inserted between an anode 501 and an organic compound film 502 in the blue organic light emitting device illustrated in FIG. 5A.

First, ITO is deposited to a thickness of about 100 nm by sputtering to form the anode 501 on the glass substrate 500. The glass substrate 500 having the anode 501 is brought into a vacuum tank as shown in FIGS. 11A and 11B. In this embodiment, five evaporation sources are necessary in order to deposit by evaporation five kinds of materials (four kinds of organic compounds and one kind of metal that forms the cathode).

First, MTDATA as a hole injection material is deposited by evaporation to a thickness of 20 nm to form a hole injecting region. When the film thickness reaches 20 nm and evaporation of MTDATA is ended, evaporation of spiro dimer of TAD (hereinafter referred to as S-TAD), that is a hole transporting material, is immediately started at an evaporation rate of 3 Å/s. No interval is allowed here to avoid formation of impurity layers as described above.

After a hole transporting region 504 consisting solely of S-TAD is formed to a thickness of 20 nm at an evaporation rate of 3 Å/s, evaporation of spiro dimer of DPVBi (hereinafter referred to as S-DPVBi), that is a light emitting material, is started at an evaporation rate of 3 Å/s with keeping the evaporation rate of S-TAD. Thus formed by coevaporation is a first mixed region 507 in which the ratio of S-TAD to S-DPVBi is 1:1. The thickness of the region 507 is set to 10 nm.

As the first mixed region 507 is formed, the evaporation of S-TAD is ended and the evaporation of S-DPVBi is continued to form a light emitting region 505. The light emitting region is to have a thickness of 20 nm. Then, evaporation of Alq, that is an electron transporting material, is started at an evaporation rate of 3 Å/s with continuing the evaporation of S-DPVBi. Thus formed by coevaporation is a second mixed region 508 in which the ratio of S-DPVBi to Alq is 1:1. The thickness of the region 508 is set to 10 nm.

As the second mixed region 508 is formed, evaporation of S-DPVBi is ended and evaporation of Alq is continued to form the electron transporting region 506 with a thickness of 40 nm. Lastly, ytterbium is deposited by evaporation to a thickness of about 400 nm as the cathode 503. The blue organic light emitting device derived from S-DPVBi is thus obtained.

Embodiment 2

Figure 5B:
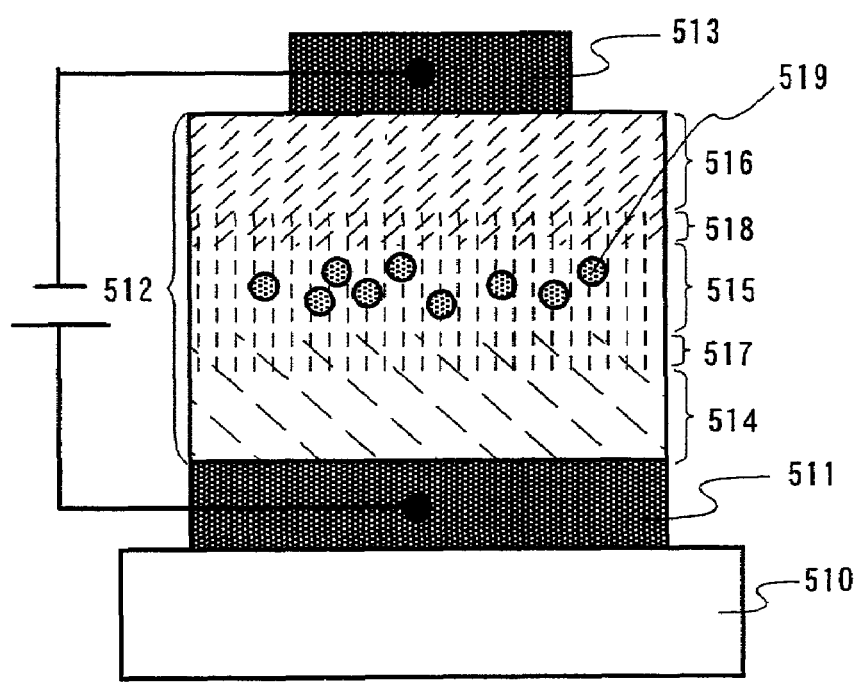

This embodiment shows a specific example of a device with a structure in which an electron injecting region is inserted between a cathode 513 and an organic compound film 512 in the blue organic light emitting device illustrated in FIG. 5B.

First, ITO is deposited to a thickness of about 100 nm by sputtering to form the anode 511 on the glass substrate 510. The glass substrate 510 having the anode 511 is brought into a vacuum tank as shown in FIGS. 11A and 11B. In this embodiment, six evaporation sources are necessary in order to deposit by evaporation six kinds of materials (five kinds of organic compounds and one kind of metal that forms the cathode).

First, the hole transporting region 514 consisting solely of TPD is formed to a thickness of 30 nm. Then, evaporation of BAlq as a host material to the light emitting material is started also at an evaporation rate of 3 Å/s with keeping the evaporation rate of TPD at 3 Å/s. In other words, the first mixed region 517 containing TPD and Alq at a ratio of 1:1 is formed by coevaporation. The first mixed region is 10 nm in thickness.

As the first mixed region 517 is formed, evaporation of TPD is ended and evaporation of BAlq is continued to form the light emitting region 515. The light emitting region is 20 nm in thickness. At this point, the light emitting region 515 is doped with 5 wt % of perylene that is a blue fluorescent pigment as the light emitting material 519.

As the light emitting region 515 is completed, evaporation of perylene is ended and evaporation of BAlq is still continued. Simultaneously, evaporation of Alq that is an electron transporting material is started at an evaporation rate of 3 Å/s. In other words, the second mixed region 518 containing BAlq and Alq at a ratio of 1:1 is formed by coevaporation. The second mixed region is 10 nm in thickness.

As the second mixed region 518 is completed, evaporation of BAlq is ended and evaporation of Alq is continued to form the electron transporting region 516 with a thickness of 30 nm. Further, as an electron injecting material, Li (acac) is formed into a film with a thickness 2 nm to be an electron injecting region.

Lastly, an Al is deposited by evaporation to a thickness of about 150 nm as the cathode. The blue organic light emitting device derived from perylene is thus obtained.

Embodiment 3

Figure 6A:
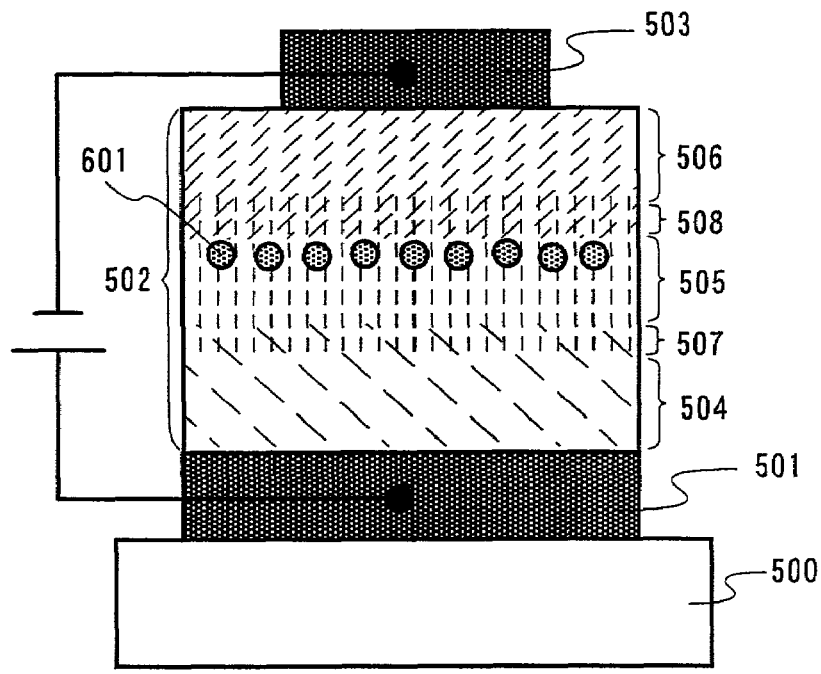
FIGS. 6A and 6B are diagrams showing structures of white organic light emitting devices.
Figure 6B:
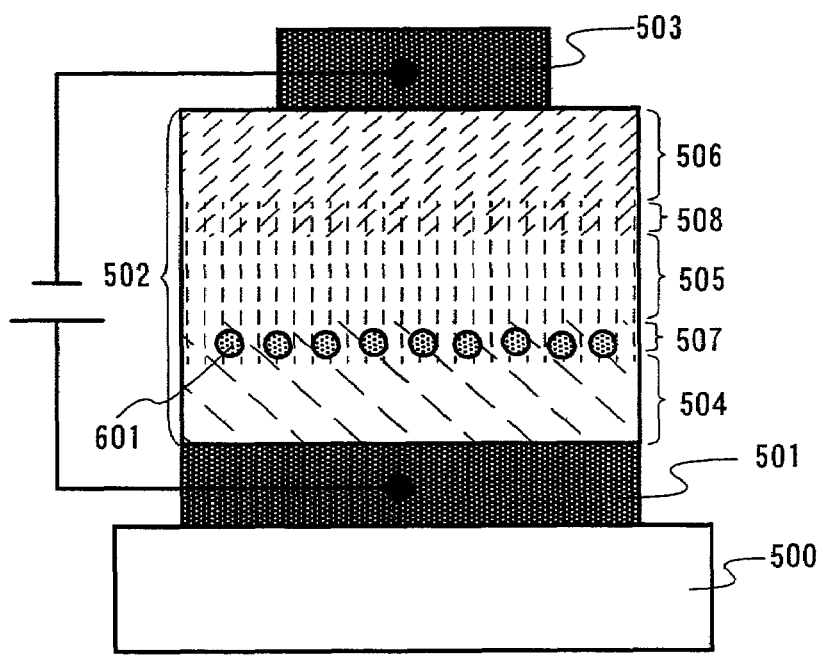

This embodiment shows a specific example of the white organic light emitting device illustrated in FIG. 6A.

First, ITO is deposited to a thickness of about 100 nm by sputtering to form the anode 501 on the glass substrate 500. The glass substrate 500 having the anode 501 is brought into a vacuum tank as shown in FIGS. 11A and 11B. In this embodiment, five evaporation sources are necessary in order to deposit by evaporation five kinds of materials (four kinds of organic compounds and one kind of metal that forms the cathode).

First, the hole transporting region 504 consisting solely of NPD is formed to a thickness of 30 nm. Then, evaporation of $Zn(BTZ)_2$ as a blue light emitting material (actually the color is blueish white that is more white than blue) is started at an evaporation rate of 3 Å/s with keeping the evaporation rate of α-NPD at 3 Å/s. In other words, the first mixed region 507 containing α-NPD and $Zn(BTZ)_2$ at a ratio of 1:1 is formed by coevaporation. The first mixed region is 10 nm in thickness.

As the first mixed region 507 is completed, evaporation of α-NPD is ended and evaporation of $Zn(BTZ)_2$ is continued to form the light emitting region 505. The light emitting region is 20 nm in thickness. At this point, the last 10 nm of the light emitting region 505 (namely, between 10 nm and 20 nm high in the 20 nm thick of light emitting region) is doped with 0.5 wt % of DCM that is a reddish orange fluorescent pigment as the second light emitting material 601.

As the light emitting region 505 is completed, evaporation of DCM is ended and evaporation of $Zn(BTZ)_2$ is still continued. Simultaneously, evaporation of BAlq that is an electron transporting material is started at an evaporation rate of 3 Å/s. In other words, the second mixed region 508 containing $Zn(BTZ)_2$ and BAlq at a ratio of 1:1 is formed by coevaporation. The second mixed region is 10 nm in thickness.

As the second mixed region 508 is completed, evaporation of $Zn(BTZ)_2$ is ended and evaporation of BAlq is continued to form the electron transporting region 506 with a thickness of 30 nm. Lastly, a Al:Li alloy is deposited by evaporation to a thickness of about 150 nm as the cathode. The white organic light emitting device is thus obtained.

Embodiment 4

Figure 7:
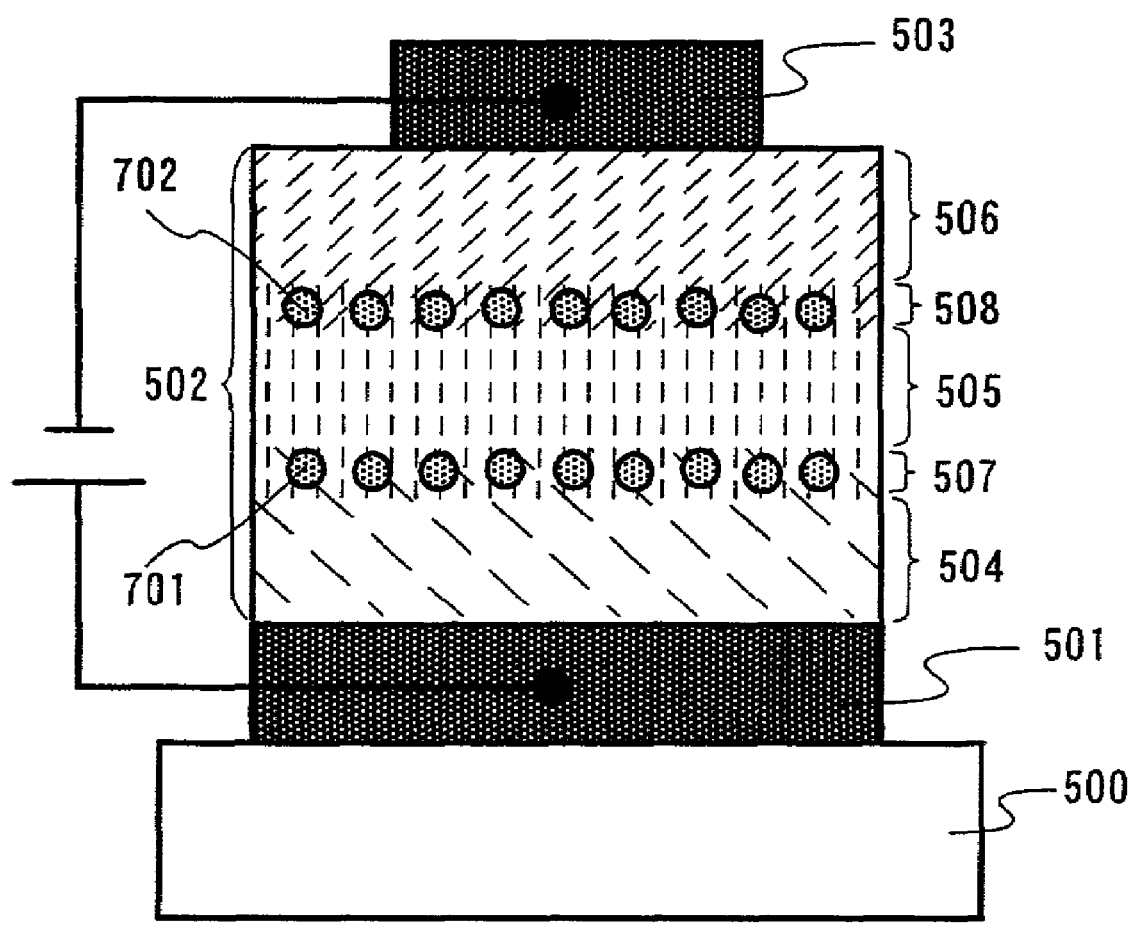
FIG. 7 is a diagram showing a structure of a white organic light emitting device.

This embodiment shows a specific example of the white organic light emitting device illustrated in FIG. 7.

First, ITO is deposited to a thickness of about 100 nm by sputtering to form the anode 501 on the glass substrate 500. The glass substrate 500 having the anode 501 is brought into a vacuum tank as shown in FIGS. 11A and 11B. In this embodiment, six evaporation sources are necessary in order to deposit by evaporation six kinds of materials (five kinds of organic compounds and one kind of metal that forms the cathode).

First, the hole transporting region 504 consisting solely of α-NPD is formed to a thickness of 30 nm. Then, evaporation of S-DPVBi as a blue light emitting material is also started at an evaporation rate of 3 Å/s with keeping the evaporation rate of α-NPD at 3 Å/s. In other words, the first mixed region 507 containing α-NPD and S-DPVBi at a ratio of 1:1 in terms of evaporation rate is formed by coevaporation. The first mixed region is 10 nm in thickness. At this point, as a second light emitting material 701, about 0.5 wt % of N,N'-dimethylquinacridone (referred to "Dmq") which is a green fluorescent pigment is added.

As the first mixed region 507 is completed, evaporation of α-NPD is ended and evaporation of S-DPVBi is continued to form the light emitting region 505. The light emitting region is 20 nm in thickness. Then, evaporation of Alq that is an electron transporting material is started at an evaporation rate of 3 Å/s with continuing the evaporation of S-DPVBi. Thus formed by coevaporation is a second mixed region 508 in which the ratio of S-DPVBi to Alq in terms of evaporation rate is 1:1. The thickness of the region 508 is set to 10 nm. At this point, 0.5 wt % of DCM that is a reddish orange fluorescent pigment is added thereto as the third light emitting material 702.

As the second mixed region 508 is completed, evaporation of S-DPVBi is ended and evaporation of Alq is continued to form the electron transporting region 506 with a thickness of 30 nm. Lastly, an Al:Li alloy is deposited by evaporation to a thickness of about 150 nm as the cathode. The white organic light emitting device is thus obtained.

Embodiment 5

Figure 8A:
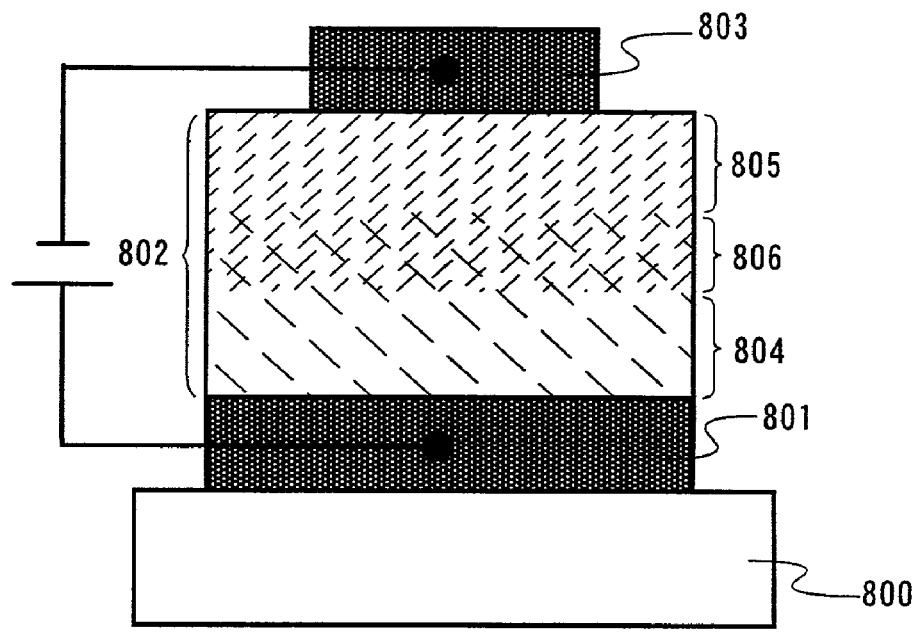
FIGS. 8A and 8B are diagrams showing structures of blue organic light emitting devices.

This embodiment shows a specific example of a device with a structure in which an electron injecting region is inserted between a cathode 803 and an organic compound film 802 in the blue organic light emitting device illustrated in FIG. 8A.

First, ITO is deposited to a thickness of about 100 nm by sputtering to form the anode 801 on the glass substrate 800. The glass substrate 800 having the anode 801 is brought into a vacuum tank as shown in FIGS. 11A and 11B. In this embodiment, four evaporation sources are necessary in order to deposit by evaporation four kinds of materials (three kinds of organic compounds and one kind of metal that forms the cathode).

First, after a hole transporting region 804 consisting solely of α-NPD is formed to a thickness of 40 nm at an evaporation rate of 3 Å/s, evaporation of BCP that is an electron transporting material is also started at an evaporation rate of 3 Å/s with keeping the evaporation rate of α-NPD. Thus formed by coevaporation is a mixed region 806 in which the ratio of α-NPD to BCP is 1:1 in terms of evaporation rate. The thickness of the region 806 is set to 20 nm.

As the mixed region 806 is completed, evaporation of α-NPD is ended and evaporation of BCP is continued to form the electron transporting region 805 which is 20 nm in thickness. Further, without interval, the evaporation of Alq that is the electron injecting material is started to form an electron injecting region with a thickness of 40 nm.

Figure 8B:
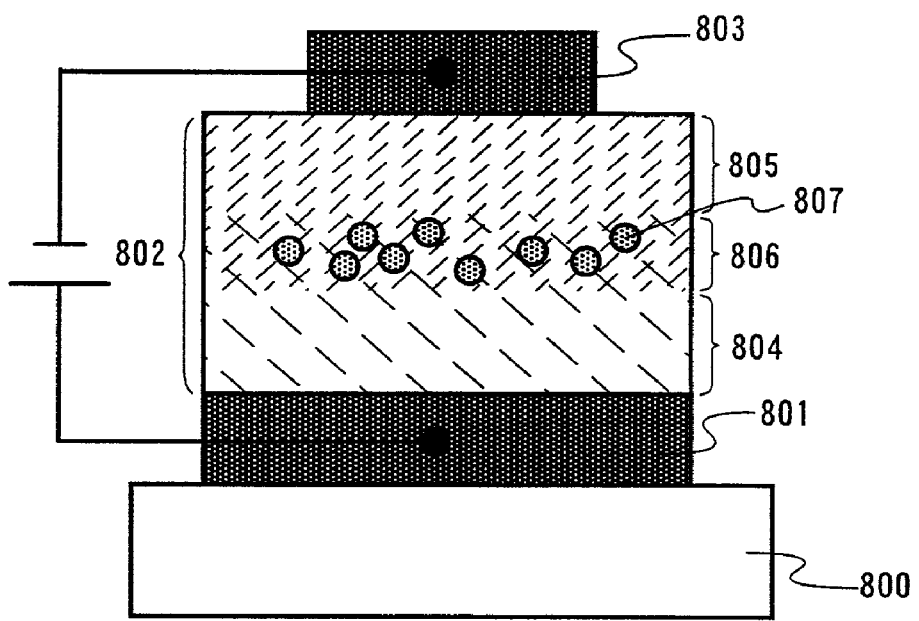

Lastly, an Al:Li alloy is deposited by evaporation to a thickness of about 150 nm as the cathode 803. The blue organic light emitting device derived from α-NPD is thus obtained. Note that, if the blue fluorescent pigment such as perylene is added to the mixed region 806, the form shown in FIG. 8B is possible.

Embodiment 6

Figure 9A:
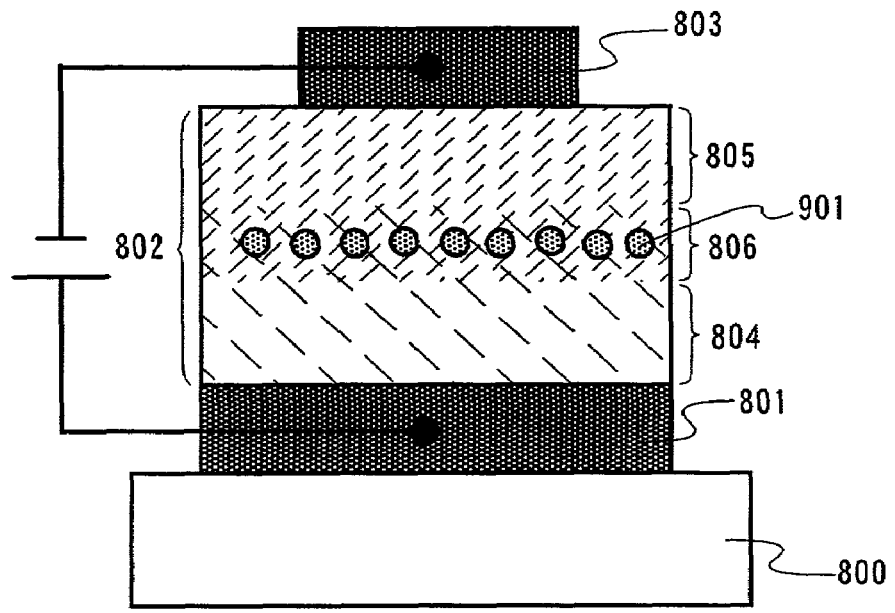
FIGS. 9A and 9B are diagrams showing structures of white organic light emitting devices.
Figure 9B:
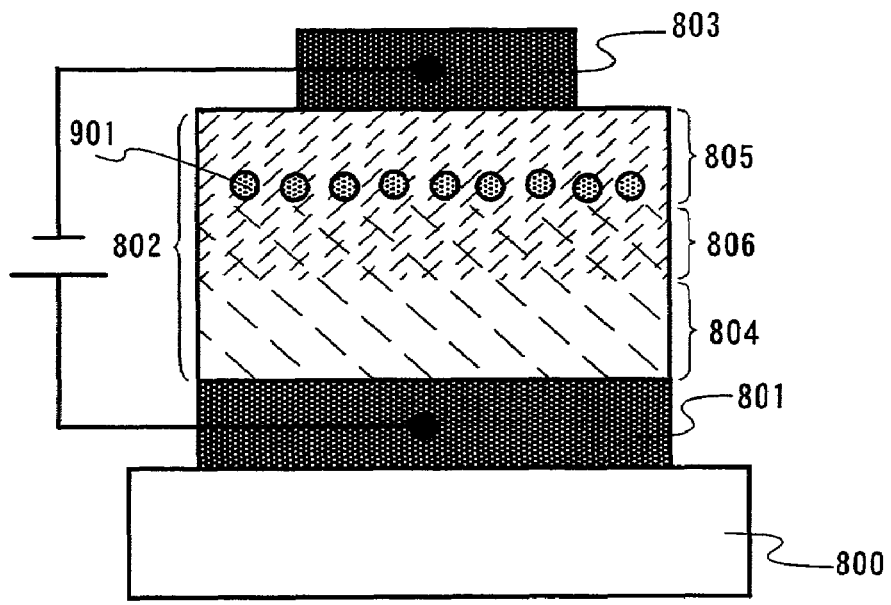

This embodiment shows a specific example of the white organic light emitting device illustrated in FIG. 9B.

First, ITO is deposited to a thickness of about 100 nm by sputtering to form the anode 801 on the glass substrate 800. The glass substrate 800 having the anode 801 is brought into a vacuum tank as shown in FIGS. 11A and 11B. In this embodiment, four evaporation sources are necessary in order to deposit by evaporation four kinds of materials (three kinds of organic compounds and one kind of metal that forms the cathode).

First, after a hole transporting region 804 consisting solely of α-NPD is formed to a thickness of 40 nm at an evaporation rate of 3 Å/s, evaporation of BAlq that is an electron transporting material is also started at an evaporation rate of 3 Å/s with keeping the evaporation rate of α-NPD. Thus formed by coevaporation is a mixed region 806 in which the ratio of α-NPD to BAlq in terms of evaporation rate is 1:1. The thickness of the region 806 is set to 20 nm.

As the mixed region 806 is completed, evaporation of α-NPD is ended and evaporation of BAlq is continued to form the electron transporting region 805 which is 40 nm in thickness. At this point, the first 10 nm of the electron transporting region 805 (namely, between 0 nm and 10 nm high in the 40 nm thick of electron transporting region) is doped with 0.5 wt % of rubrene that is a yellow fluorescent pigment as the second light emitting material 901.

Lastly, an Al:Li alloy is deposited by, evaporation to a thickness of about 150 nm as the cathode 803. The white organic light emitting device is thus obtained.

Embodiment 7

Figure 10:
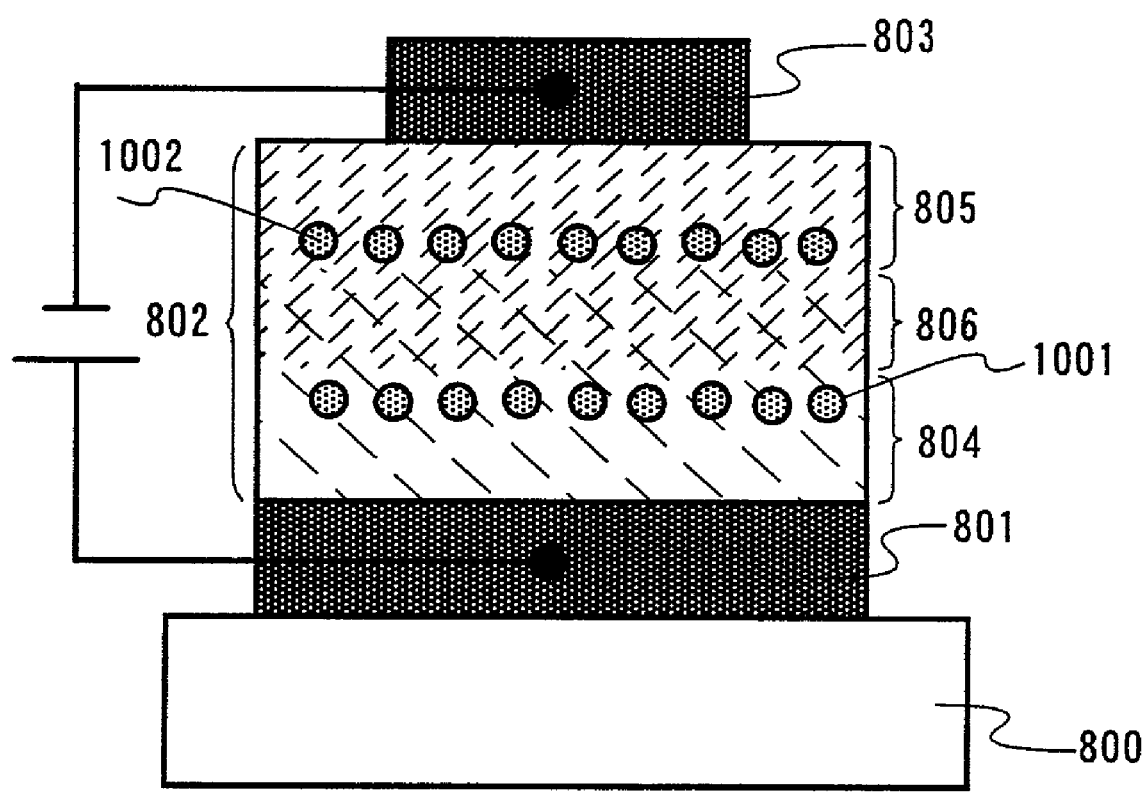
FIG. 10 is a diagram showing a structure of a white organic light emitting device.

This embodiment shows a specific example of the white organic light emitting device illustrated in FIG. 10.

First, ITO is deposited to a thickness of about 100 nm by sputtering to form the anode 801 on the glass substrate 800. The glass substrate 800 having the anode 801 is brought into a vacuum tank as shown in FIGS. 11A and 11B. In this embodiment, five evaporation sources are necessary in order to deposit by evaporation five kinds of materials (four kinds of organic compounds and one kind of metal that forms the cathode).

First, a hole transporting region 804 consisting solely of α-NPD is formed to a thickness of 40 nm at an evaporation rate of 3 Å/s. At this point, the last 10 nm of the hole transporting region 804 (namely, between 30 nm and 40 nm high in the 40 nm thick of hole transporting region) is doped with 0.5 wt % of DMq that is a green fluorescent pigment as the second light emitting material 1001.

Next, after a hole transporting region 804 is formed, evaporation of BAlq that is an electron transporting material is also started at an evaporation rate of 3 Å/s with keeping the evaporation rate of -NPD. Thus formed by coevaporation is a mixed region 806 in which the ratio of α-NPD to BAlq in terms of evaporation rate is 1:1. The thickness of the region 806 is set to 30 nm.

After the mixed region 806 is completed, evaporation of α-NPD is ended and evaporation of BAlq is continued to form the electron transporting region 805 with a thickness of 40 nm. At this point, the first 10 nm of the electron transporting region 805 (namely, between 0 nm and 10 nm high in the 40 nm thick of electron transporting region) is doped with 0.5 wt % of DCM that is a reddish orange fluorescent pigment as the third light emitting material 1002.

Lastly, an Al:Li alloy is deposited by evaporation to a thickness of about 150 nm as the cathode 803. The white organic light emitting device is thus obtained.

Embodiment 8

This embodiment describes a display device that includes an organic light emitting device according to the present invention. FIGS. 13A and 13B are sectional views of an active matrix display device that uses an organic light emitting device of the present invention.

A thin film transistor (hereinafter referred to as TFT) is used here as an active device, but the active device may be a MOS transistor. The TFT shown as an example is a top gate TFT (planar TFT, to be specific), but a bottom gate TFT (typically a reverse stagger TFT) may be used instead.

In FIG. 13A, 1301 denotes a substrate. The substrate used here can transmit visible light so that light is taken out from the substrate side. Specifically, a glass substrate, a quartz substrate, a crystal glass substrate, or a plastic substrate (including a plastic film) can be used. The substrate 1301 refers to the substrate plus an insulating film formed on the surface of the substrate.

On the substrate 1301, a pixel portion 1311 and a driving circuit 1312 are provided. The pixel portion 1311 will be described first.

The pixel portion 1311 is a region for displaying an image. A plurality of pixels are placed on the substrate, and each pixel is provided with a TFT 1302 for controlling a current flowing in the organic light emitting device (hereinafter referred to as current controlling TFI), a pixel electrode (anode) 1303, an organic compound film 1304 according to the present invention, and a cathode 1305. Although only the current controlling TFT is shown in FIG. 13A, each pixel has a TFT for controlling a voltage applied to a gate of the current controlling TFT (hereinafter referred to as switching TFT).

The current controlling TFT 1302 here is preferably a p-channel TFT. Though an n-channel TFT may be used instead, a p-channel TFT as the current controlling TFT is more successful in reducing current consumption if the current controlling TFT is connected to the anode of the organic light emitting device as in FIGS. 13A and 13B. The switching TFT may be an n-channel TFT or a p-channel TFT.

A drain of the current controlling TFF 1302 is electrically connected to the pixel electrode 1303. In this embodiment, a conductive material having a work function of 4.5 to 5.5 eV is used as the material of the pixel electrode 1303 and, therefore, the pixel electrode 1303 functions as the anode of the organic light emitting device. A light-transmissive material, typically, indium oxide, tin oxide, zinc oxide, or a compound of these (ITO, for example), is used for the pixel electrode 1303. On the pixel electrode 1303, the organic compound film 1304 is formed.

On the organic compound film 1304, the cathode 1305 is placed. The material of the cathode 1305 is desirably a conductive material having a work function of 2.5 to 3.5 eV. Typically, the cathode 1305 is formed from a conductive film containing an alkaline metal element or an alkaline-earth metal element, or from a conductive film containing aluminum, or from a laminate obtained by layering an aluminum or silver film on one of the above conductive films.

A layer composed of the pixel electrode 1303, the organic compound film 1304, and the cathode 1305 is covered with a protective film 1306. The protective film 1306 is provided to protect the organic light emitting device from oxygen and moisture. Materials usable for the protective film 1306 include silicon nitride, silicon oxynitride, aluminum oxide, tantalum oxide, and carbon (specifically, diamond-like carbon).

Denoted by 1320 is a color conversion layer or a color filter as those shown in FIGS. 12A and 12B. In the example shown here, the layer or filter is formed in a dent that is obtained by processing the substrate 1301. When the organic compound film 1304 emits blue light, a color conversion layer is used whereas a color filter is used when the organic compound film 1304 emits white light.

Next, the driving circuit 1312 will be described. The driving circuit 1312 is a region for controlling timing of signals (gate signals and data signals) to be sent to the pixel portion 1311, and is provided with a shift register, a buffer, and a latch, as well as an analog switch (transfer gate) or level shifter. In FIG. 13A, the basic unit of these circuits is a CMOS circuit composed of an n-channel TFT 1307 and a p-channel TFT 1308.

Known circuit structures can be applied to the shift register, the buffer, and the latch, and the analog switch (transfer gate) or level shifter. Although the pixel portion 1311 and the driving circuit 1312 are provided on the same substrate in FIGS. 13A and 13B, an IC or LSI may be electrically connected instead of placing the driving circuit 1312 on the substrate.

The pixel electrode (anode) 1303 is electrically connected to the current controlling TFT 1302 in FIGS. 13A and 13B but the cathode may be connected to the current controlling TFT instead. In this case, the pixel electrode may be formed from the material of the cathode 1305 whereas the cathode may be formed from the material of the pixel electrode (anode) 1303. The current controlling TFT in this case is preferably an n-channel TFT.

The display device shown in FIG. 13A is manufactured by a process in which formation of the pixel electrode 1303 precedes formation of a wiring line 1309. However, this process could roughen the surface of the pixel electrode 1303. The roughened surface of the pixel electrode 1303 may degrade characteristic of the organic light emitting device since it is a current-driven type device.

Therefore the pixel electrode 1303 may be formed after forming the wiring line 1309 to obtain the display device shown in FIG. 13B. In this case, injection of current from the pixel electrode 1303 is improved compared to the structure of FIG. 13A.

Figure 14:
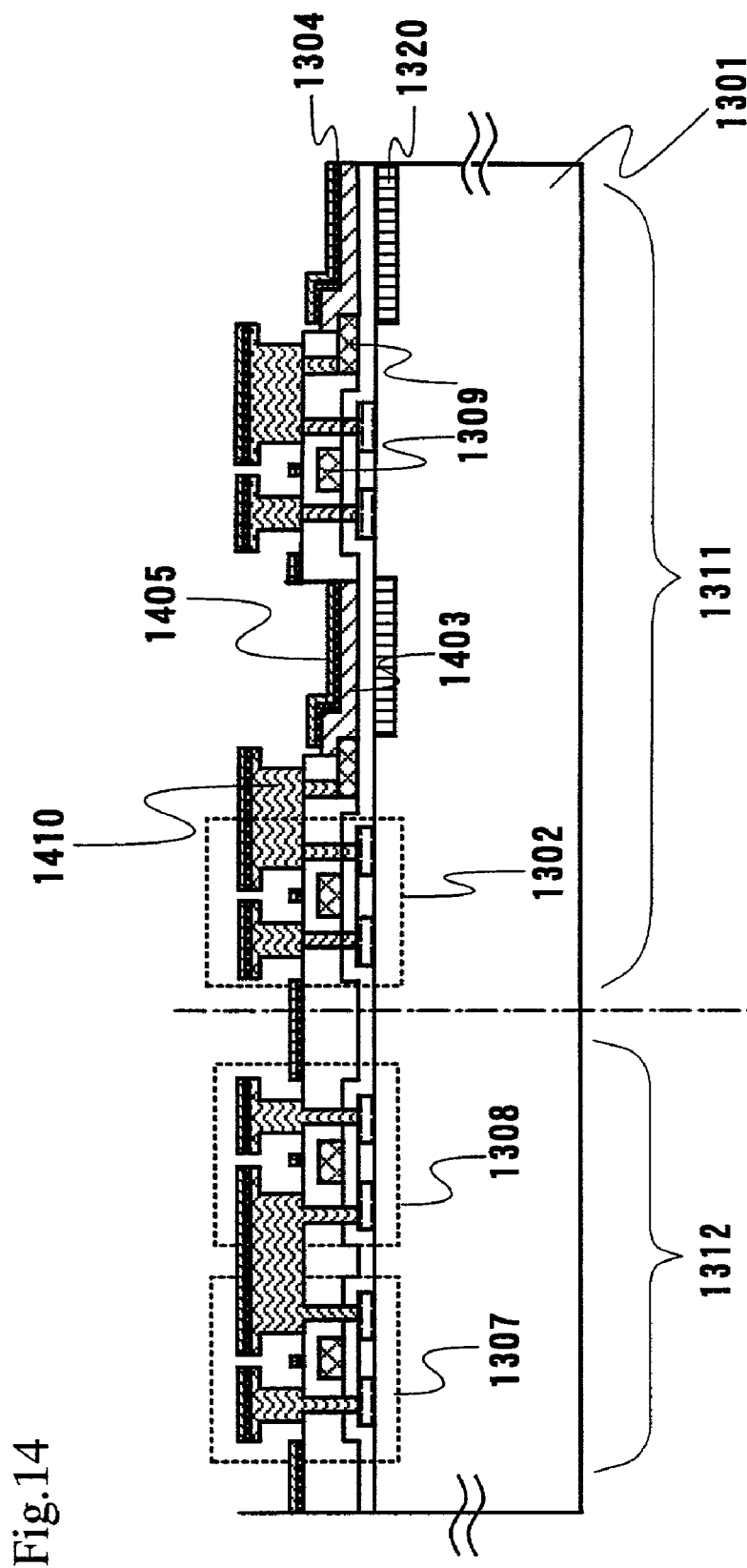
FIG. 14 is a diagram showing a sectional structure of a display device.

In FIGS. 13A and 13B, a forward-tapered bank structure 1310 separates the pixels placed in the pixel portion 1311 from one another. If this bank structure is reverse-tapered, for example, a contact between the bank structure and the pixel electrode can be avoided. An example thereof is shown in FIG. 14. The same components as those in FIGS. 13A and 13B are denoted by the same symbols.

In FIG. 14, a wiring line also serves as a separation portion, forming a wiring line and separation portion 1410. The shape of the wiring line and separation portion 1410 shown in FIG. 14 (namely, a structure with eaves) is obtained by layering a metal that constitutes the wiring line and a material lower in etch rate than the metal (a metal nitride, for example) and then etching the resultant laminate. This shape can prevent short circuit between a cathode 1405 and a pixel electrode 1403 or the wiring line. Unlike a usual active matrix display device, the cathode 1405 on the pixel is striped in the device of FIG. 14 (similar to a cathode in a passive matrix device).

FIGS. 15A and 15B show the exterior of the active matrix display device illustrated in FIG. 13B. FIG. 15A is a top view thereof and FIG. 15B is a sectional view taken along the line P-P' of FIG. 15A. The symbols in FIGS. 13A and 13B are used in FIGS. 15A and 15B.

In FIG. 15A, 1501 denotes a pixel portion, 1502 denotes a gate signal side driving circuit, and 1503 denotes a data signal side driving circuit. Signals to be sent to the gate signal side driving circuit 1502 and the data signal side driving circuit 1503 are inputted from a TAB (tape automated bonding) tape 1505 through an input wiring line 1504. Though not shown in the drawing, the TAB tape 1505 may be replaced by a TCP (tape carrier package) that is obtained by providing a TAB tape with an IC (integrated circuit).

Denoted by 1506 is the cover member that is provided in an upper part of the display device shown in FIG. 13B, and is bonded with a seal member 1507 formed of a resin. The cover member 1506 may be any material as long as it does not transmit oxygen and water. In this embodiment, as shown in FIG. 15B, the cover member 1506 is composed of a plastic member 1506a and carbon films (specifically, diamond-like carbon films) 1506b and 1506c that are formed on the front surface and back surface of the plastic member 1506a, respectively.

As shown in FIG. 15B, the seal member 1507 is covered with a sealing member 1508 made of a resin so that the organic light emitting device is completely sealed in an airtight space 1509. The airtight space 1509 may be filled with inert gas (typically, nitrogen gas or noble gas), a resin, or inert liquid (for example, liquid fluorocarbon typical example of which is perfluoro alkane). It is also effective to put an absorbent or deoxidant in the space.

A polarizing plate may be provided on a display face (the face on which an image is displayed to be observed by a viewer) of the display device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting devices according to the present invention can be used as the organic light emitting device included in the display device of this embodiment.

Embodiment 9

Figure 16:
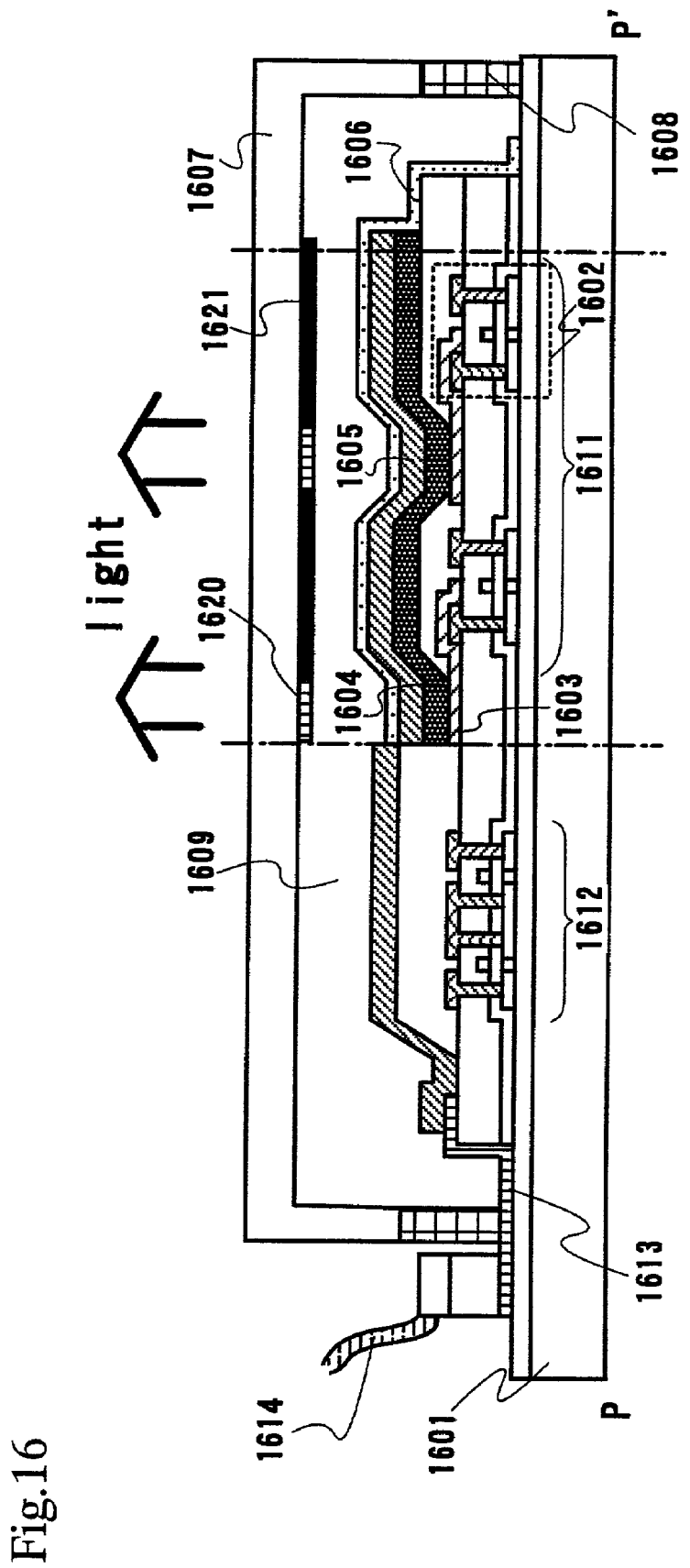
FIG. 16 is a diagram showing a sectional structure of a display device.

This embodiment shows an active matrix display device as an example of a display device that includes an organic light emitting device according to the present invention. Unlike Embodiment 8, in the display device of this embodiment, light is taken out from the opposite side of a substrate on which an active device is formed (hereinafter referred to as upward emission). FIG. 16 is a sectional view thereof.

A thin film transistor (hereinafter referred to as TFT) is used here as the active device, but the active device may be a MOS transistor. The TFT shown as an example is a top gate TFT (planar TFT, to be specific), but a bottom gate TFT (typically a reverse stagger TFT) may be used instead.

A substrate 1601, a current controlling TFT 1602 that is formed in a pixel portion 1611, and a driving circuit 1612 of this embodiment have the same structures as those of Embodiment 8.

A first electrode 1603, which is connected to a drain of the current controlling TFT 1602, is used as an anode in this embodiment, and therefore is formed preferably from a conductive material having a large work function. Typical examples of the conductive material include nickel, palladium, tungsten, gold, silver, and like other metals. In this embodiment, the first electrode 1603 desirably does not transmit light. More desirably, the electrode is formed from a material that is highly reflective of light.

On the first electrode 1603, an organic compound film 1604 is formed. Provided on the organic compound film 1604 is a second electrode 1605, which serves as a cathode in this embodiment. Accordingly, the material of the second electrode 1605 is desirably a conductive material having a work function of 2.5 to 3.5 eV. Typically, a conductive film containing an alkaline metal element or an alkaline-earth metal element, or a conductive film containing aluminum, or a laminate obtained by layering an aluminum or silver film on one of the above conductive films is used. However, being light-transmissive is indispensable for the material of the second electrode 1605 since upward emission is employed in this embodiment. Therefore, when used for the second electrode, the metal is preferably formed into a very thin film about 20 nm in thickness.

A layer composed of the first electrode 1603, the organic compound film 1604, and the second electrode 1605 is covered with a protective film 1606. The protective film 1606 is provided to protect the organic light emitting device from oxygen and moisture. In this embodiment, any material can be used for the protective film as long as it transmits light.

The first electrode (anode) 1603 is electrically connected to the current controlling TFT 1602 in FIG. 16 but the cathode may be connected to the current controlling TFT instead. In this case, the first electrode is formed from the material of the cathode whereas the second electrode is formed from the material of the anode. The current controlling TFT in this case is preferably an n-channel TFT.

Denoted by 1607 is a cover member and is bonded with a seal member 1608 formed of a resin. The cover member 1607 may be any material as long as it transmits light but not oxygen and water. In this embodiment, glass is used. An airtight space 1609 may be filled with inert gas (typically, nitrogen gas or noble gas), a resin, or inert liquid (for example, liquid fluorocarbon typical example of which is perfluoro alkane). It is also effective to put an absorbent or deoxidant in the space.

Denoted by 1620 is a color conversion layer or a color filter as those shown in FIGS. 12A and 12B. In the example shown here, the layer or filter is provided in the cover member 1607. When the organic compound film 1604 emits blue light, a color conversion layer is used whereas a color filter is used when the organic compound film 1604 emits white light.

In this embodiment, the distance between 1620 and the organic compound film is larger than in Embodiment 8. Therefore colors of light might be mixed when 1620 is formed simply by patterning (could be affected by light emitted from adjacent pixels). A black matrix 1621 is therefore employed in this embodiment to lessen the influence of light emitted from adjacent pixels.

Signals to be sent to the gate signal side driving circuit and the data signal side driving circuit are inputted from a TAB (tape automated bonding) tape 1614 through an input wiring line 1613. Though not shown in the drawing, the TAB tape 1614 may be replaced by a TCP (tape carrier package) that is obtained by providing a TAB tape with an IC (integrated circuit).

A polarizing plate may be provided on a display face (the face on which an image is displayed to be observed by a viewer) of the display device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting devices according to the present invention can be used as the organic light emitting device included in the display device of this embodiment.

Embodiment 10

Figure 17A:
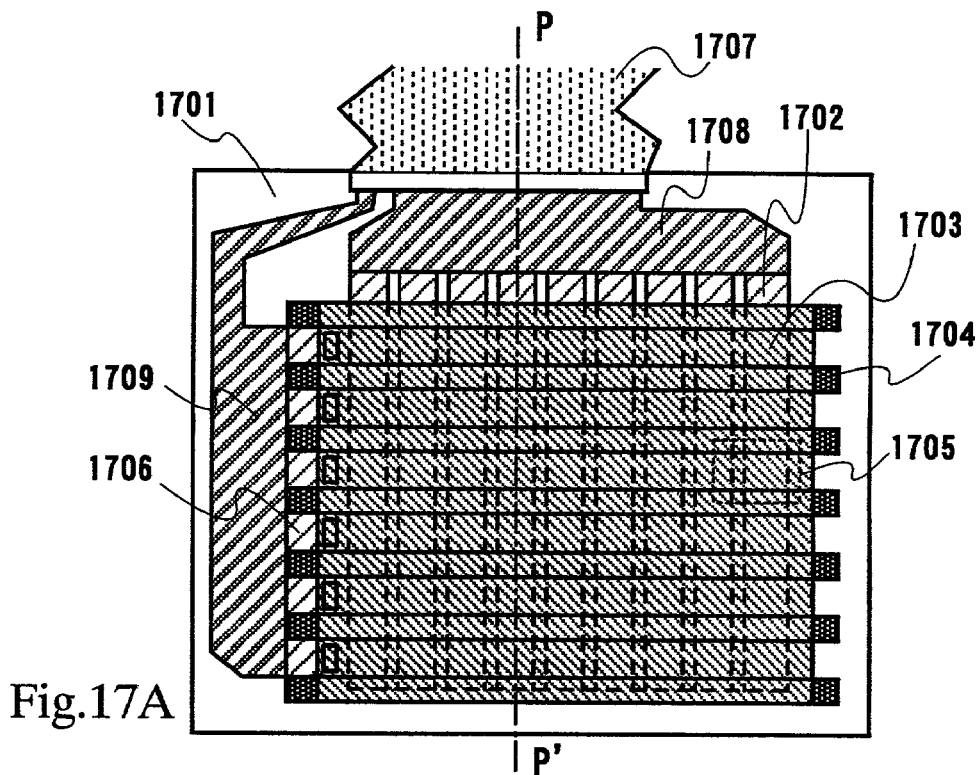
FIGS. 17A to 17C are diagrams of a display device, with FIG. 17A showing a top structure thereof and FIGS. 17B and 17C showing sectional structure thereof.
Figure 17B:
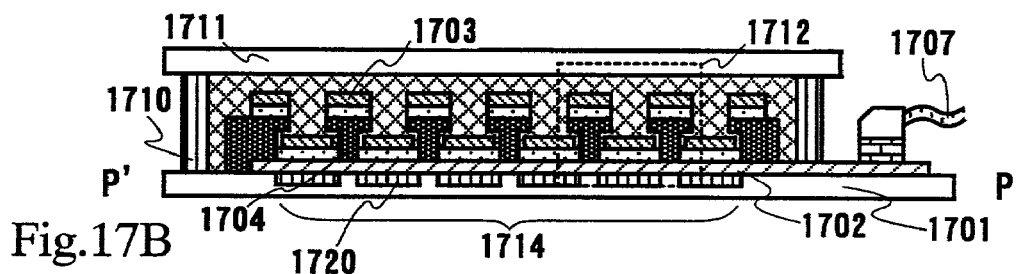

This embodiment describes a passive matrix display device as an example of a display device that includes an organic light emitting device of the present invention. FIG. 17A is a top view of the display device and FIG. 17B is a sectional view taken along the line P-P' of FIG. 17A.

In FIG. 17A, denoted by 1701 is a substrate, which is formed of a plastic member here. The plastic member used is a plate or film of polyimide, polyamide, an acrylic resin, an epoxy resin, PES (polyethylene sulfile), PC (polycarbonate), PET (polyethylene terephthalate), or PEN (polyethylene naphthalate).

Reference numeral 1702 denotes scanning lines (anodes) formed from a conductive oxide film. In this embodiment, the conductive oxide film is obtained by doping zinc oxide with gallium oxide. 1703 denotes data lines (cathodes) formed from a metal film, a bismuth film, in this embodiment. 1704 denotes banks formed of an acrylic resin. The banks function as partition walls that separate the data lines 1703 from one another. A plurality of scanning lines 1702 and a plurality of data lines 1703 respectively form stripe patterns and the patterns cross each other at right angles. Though not shown in FIG. 17A, an organic compound film is sandwiched between the scanning lines 1702 and the data lines 1703 and intersection portions 1705 serve as pixels.

The scanning lines 1702 and the data lines 1703 are connected to an external driving circuit through a TAB tape 1707. 1708 denotes a group of wiring lines comprised of a mass of the scanning lines 1702. 1709 denotes a group of wiring lines comprised of a mass of connection wiring lines 1706 that are connected to the data lines 1703. Though not shown, the TAB tape 1707 may be replaced by TCP that is obtained by providing a TAB tape with an IC.

In FIG. 17B, 1710 denotes a seal member and 1711 denotes a cover member that is bonded to a plastic member 1701 with the seal member 1710. A photo-curable resin can be used for the seal member 1710. A preferable material of the seal member is one which allows little gas leakage and which absorbs little moisture. The cover member is preferably made from the same material as the substrate 1701, and glass (including silica glass) or plastic can be used. Here, a plastic material is used for the cover member.

Denoted by 1720 is a color conversion layer or a color filter as those shown in FIGS. 12A and 12B. In the example shown here, the layer or filter is formed in a dent that is obtained by processing the substrate 1701. When an organic compound film 1713 emits blue light, a color conversion layer is used whereas a color filter is used when the organic compound film 1713 emits white light.

Figure 17C:
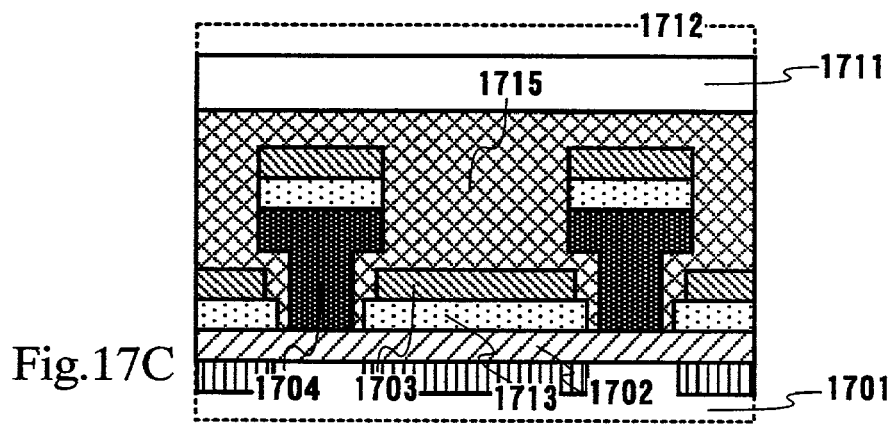

FIG. 17C is an enlarged view of the structure 1712 of a pixel region. 1713 denotes the organic compound film. As shown in FIG. 17C, lower layers of the banks 1704 are narrower than upper layers and therefore the banks can physically separate the data lines 1703 from one another. A pixel portion 1714 surrounded by the seal member 1710 is shut off of the outside air by a sealing member 1715 formed of a resin. Degradation of the organic compound film is thus prevented.

In the display device structured as above in accordance with the present invention, the pixel portion 1714 is composed of the scanning lines 1702, the data lines 1703, the banks 1704, and the organic compound film 1713. Therefore the display device can be manufactured by a very simple process.

A polarizing plate may be provided on a display face (the face on which an image is displayed to be observed by a viewer) of the display device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Any of organic light emitting devices according to the present invention can be used as the organic light emitting device included in the display device of this embodiment.

Embodiment 11

This embodiment shows an example of attaching a printed wiring board to the display device shown in Embodiment 10 to make the device into a module.

Figure 18A:
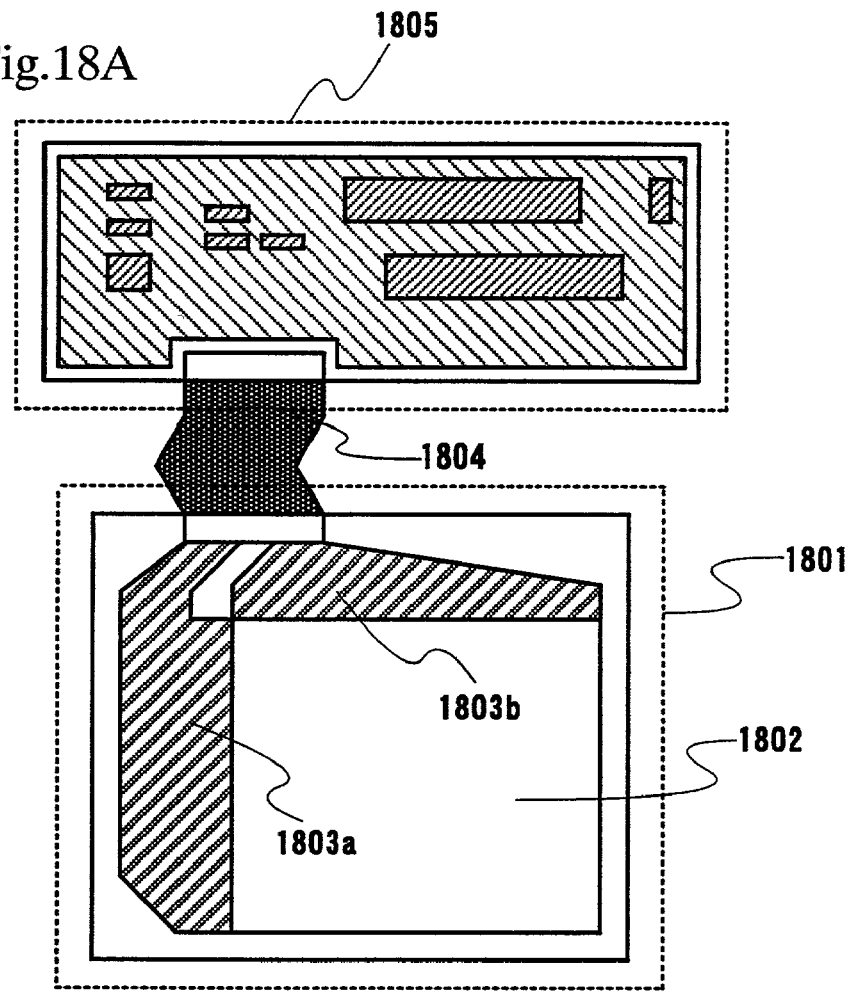
FIGS. 18A and 18B are diagrams showing the structure of a display device.

In a module shown in FIG. 18A, a TAB tape 1804 is attached to a substrate 1801 (here including a pixel portion 1802 and wiring lines 1803a and 1803b), and a printed wiring board 1805 is attached to the substrate through the TAB tape 1804.

Figure 18B:
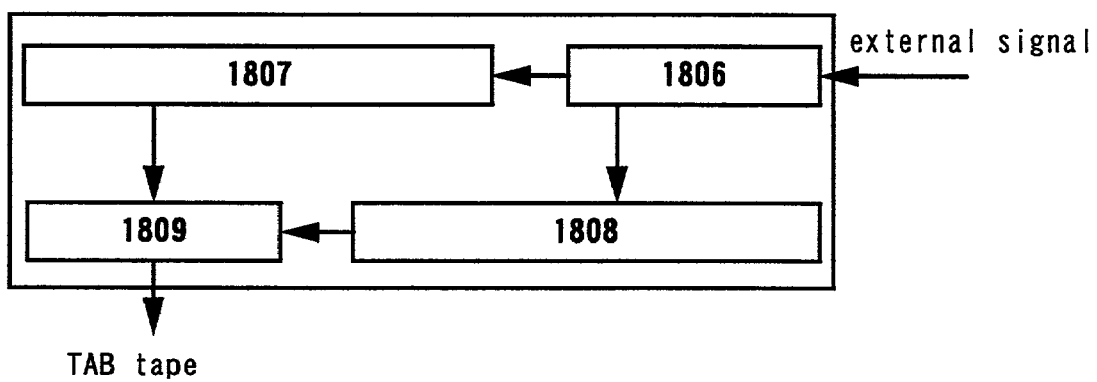

A functional block diagram of the printed wiring board 1805 is shown in FIG. 18B. An IC functioning as at least I/O ports (input or output portions) 1806 and 1809, a data signal side driving circuit 1807, and a gate signal side driving circuit 1808 is provided within the printed wiring board 1805.

In this specification, a module structured by attaching a TAB tape to a substrate with a pixel portion formed on its surface and by attaching a printed wiring board that functions as a driving circuit to the substrate through the TAB tape as above is specially called a module with external driving circuit.

Any of organic light emitting devices according to the present invention can be used as the organic light emitting device included in the display device of this embodiment.

Embodiment 12

This embodiment shows an example of attaching a printed wiring board to the display device shown in Embodiment 8, 9, or 10 to make the device into a module.

Figure 19A:
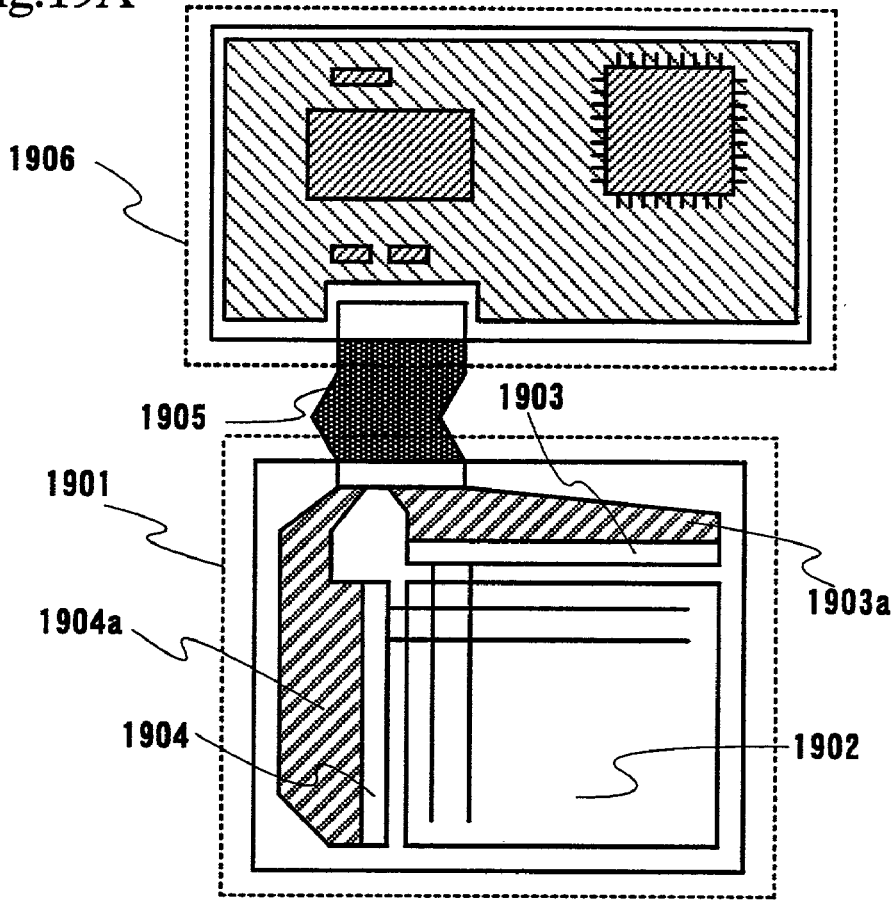
FIGS. 19A and 19B are diagrams showing the structure of a display device.

In a module shown in FIG. 19A, a TAB tape 1905 is attached to a substrate 1901 (here including a pixel portion 1902, a data signal side driving circuit 1903, a gate signal side driving circuit 1904, and wiring lines 1903a and 1904a), and a printed wiring board 1906 is attached to the substrate through the TAB tape 1905. A functional block diagram of the printed wiring board 1906 is shown in FIG. 19B.

Figure 19B:
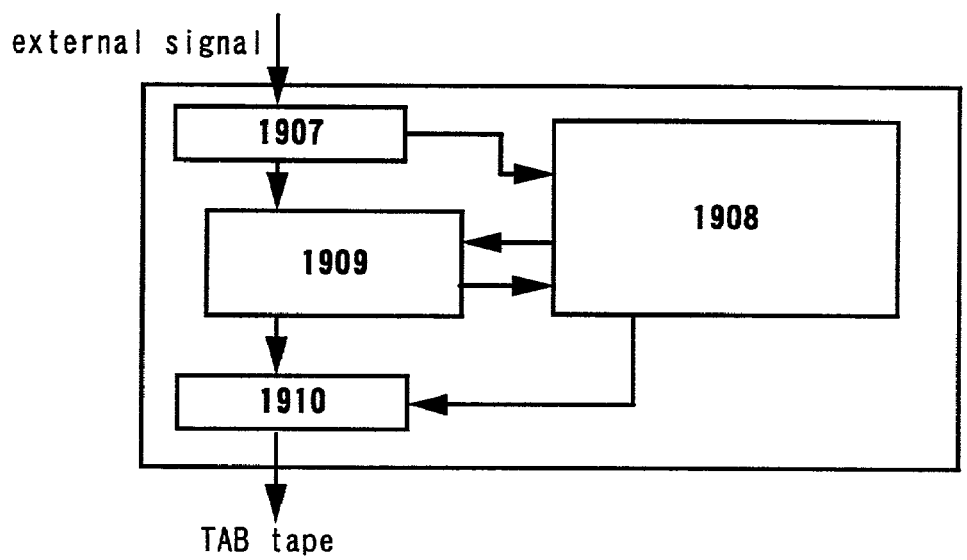

As shown in FIG. 19B, an IC functioning as at least I/O ports 1907 and 1910 and a control unit 1908 is provided within the printed wiring board 1906. A memory unit 1909 is provided here but it is not always necessary. The control unit 1908 is a portion having functions for controlling the driving circuits and correction of image data.

In this specification, a module structured by attaching a printed wiring board that has functions as a controller to a substrate on which an organic light emitting device is formed as above is specially called a module with external controller.

Any of organic light emitting devices according to the present invention can be used as the organic light emitting device included in the display device of this embodiment.

Embodiment 13

This embodiment shows an example of a display device in which an organic light emitting device is driven at a constant voltage in accordance with digital time gray scale display. The display device of the present invention can provide uniform images in digital time gray scale display and therefore is very useful.

FIG. 20A shows the circuit structure of a pixel having an organic light emitting device. Tr represents a transistor and Cs represents a storage capacitor. In this circuit, when a gate line is selected, a current flows into Tr1 from a source line and a voltage is accumulated in Cs in an amount determined by the signal. Then a current controlled by the gate-source voltage ($V_{gs}$) of Tr2 flows into Tr2 and the organic light emitting device.

When Tr1 is no longer selected, Tr1 is turned OFF to hold the voltage ($V_{gs}$) of Cs. Accordingly, a current continues to flow in an amount dependent on $V_{gs}$.

FIG. 20B shows a chart for driving this circuit in accordance with digital time gray scale display. In digital time gray scale display, one frame is divided into plural sub-frames. FIG. 20B shows 6 bit gray scale in which one frame is divided into six sub-frames. In this case, the ratio of light emission periods of the sub-frames is 32:16:8:4:2:1.

Figure 20C:
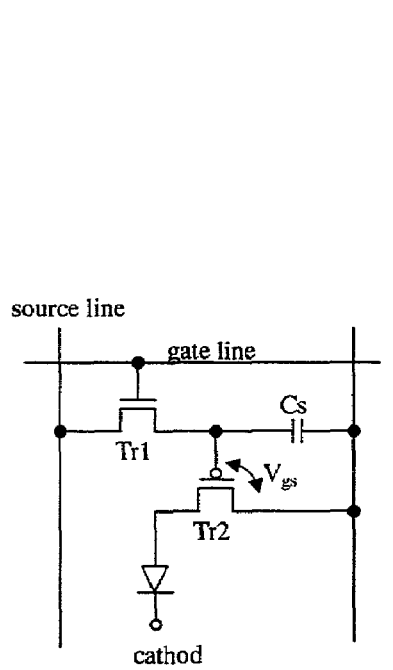
Figure 20C:
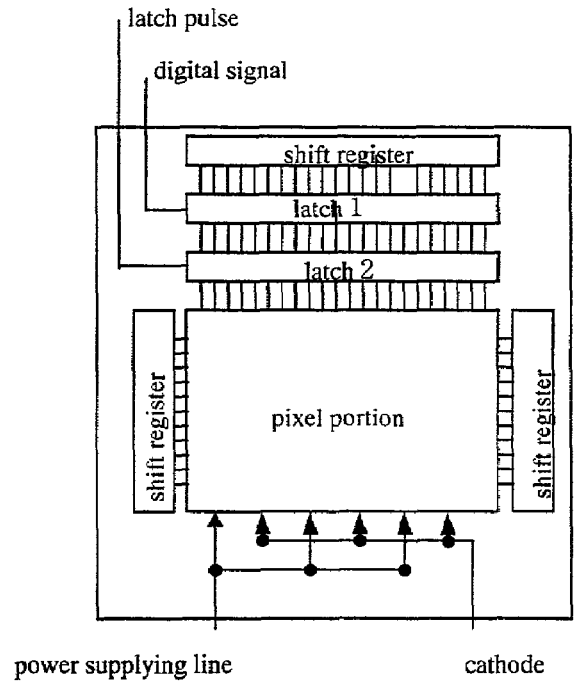
Figure 20C:
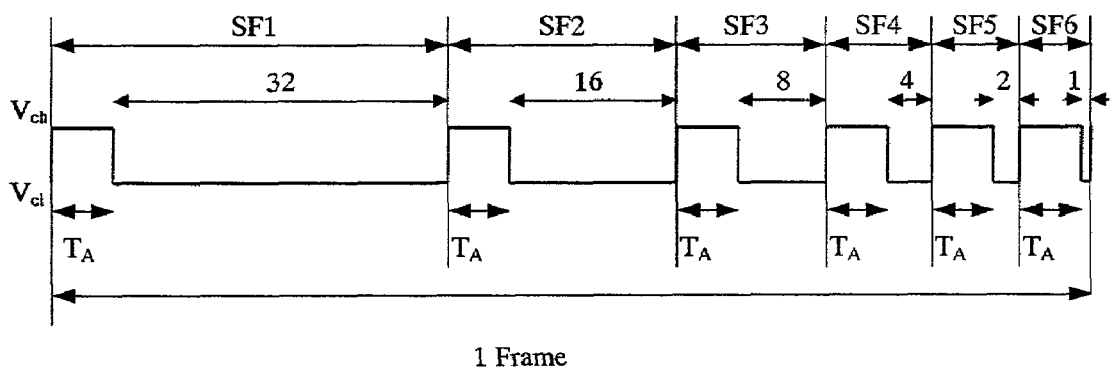

FIG. 20C schematically shows driving circuits on a TFT substrate of this embodiment. A gate driver and a source driver are provided on the same substrate. In this embodiment, the pixel circuit and the drivers are designed to be digitally driven. Accordingly, fluctuation in TFT characteristic does not affect the device and the device can display uniform images.

Embodiment 14

This embodiment describes an active matrix constant current driving circuit that is driven by flowing a constant current into an organic light emitting device of the present invention. The circuit structure of the driving circuit is shown in, FIG. 23.

Figure 23:
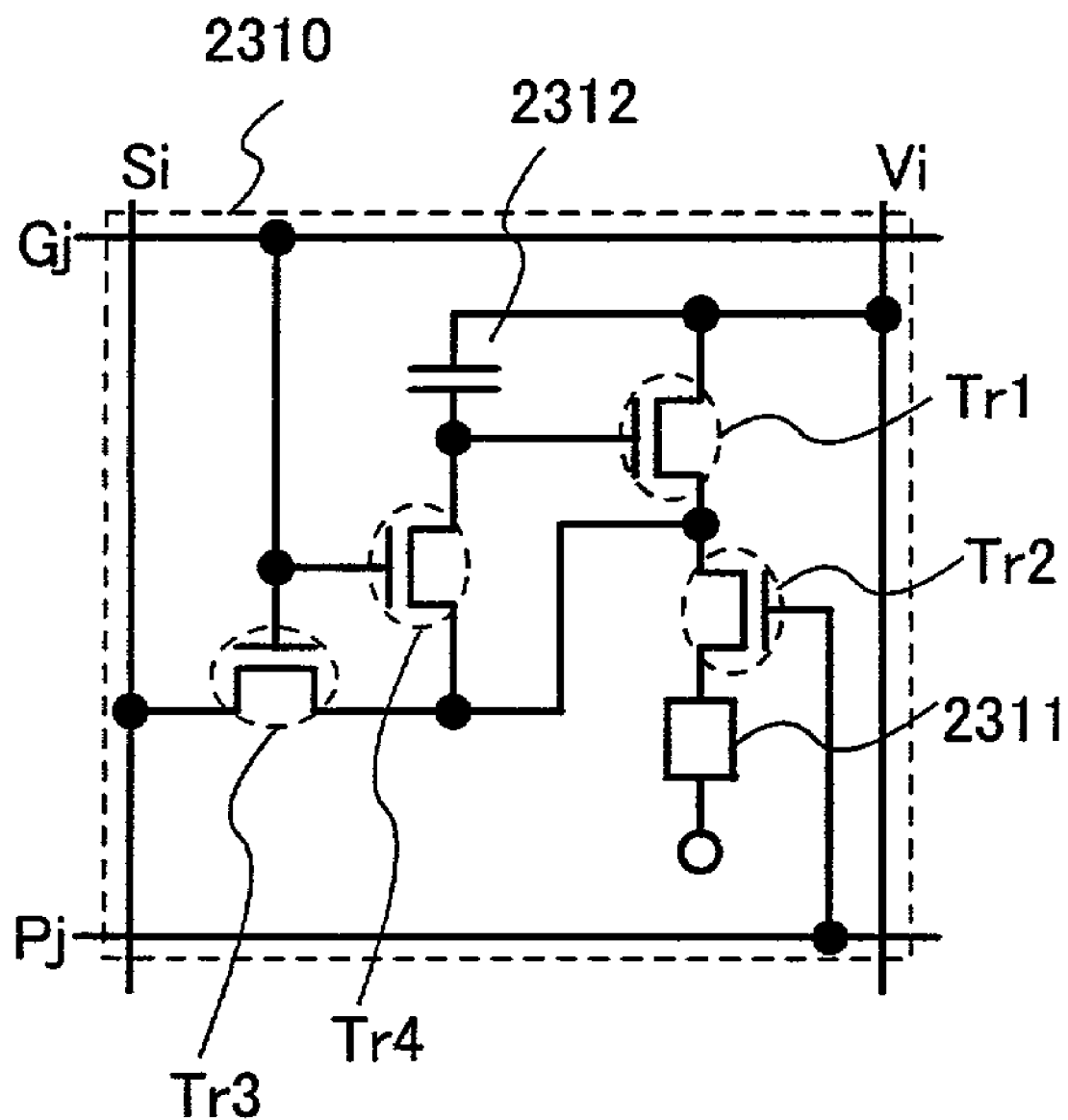
FIG. 23 is a diagram showing the structure of a display device.

A pixel 2310 in FIG. 23 has a signal line Si, a first scanning line Gj, a second scanning line Pj, and a power supply line Vi. The pixel 2310 also has transistors Tr1, Tr2, Tr3, and Tr4, an organic light emitting device 2311 of mixed junction type, and a capacitor storage 2312.

Gates of Tr3 and Tr4 are both connected to the first scanning line Gj. Tr3 has a source and a drain one of which is connected to the signal line Si and the other of which is connected to a source of Tr2. Tr4 has a source and a drain one of which is connected to the source of Tr2 and the other of which is connected to a gate of Tr1. In short, the source or drain of Tr3 is connected to the source or drain of Tr4.

A source of Tr1 is connected to the power supply line Vi, and a drain of Tr1 is connected to the source of Tr2. A gate of Tr2 is connected to the second scanning line Pj. A drain of Tr2 is connected to a pixel electrode of the organic light emitting device 2311. The organic light emitting device 2311 has the pixel electrode, an opposite electrode, and an organic light emitting layer interposed between the pixel electrode and the opposite electrode. The opposite electrode receives a constant voltage from a power supply external to the light emitting panel.

Tr3 may be an n-channel TFT or a p-channel TFT and the same applies to Tr4. However, Tr3 and Tr4 have to have the same polarity. Tr1 may be an n-channel TFT or a p-channel TFT. Tr2 may be an n-channel TFT or a p-channel TFT. One of the pixel electrode and the opposite electrode of the light emitting device serves as an anode and the other serves as a cathode. When Tr2 is a p-channel TFT, it is desirable to use the pixel electrode as an anode and the opposite electrode as a cathode. On the other hand, the pixel electrode is desirably used as a cathode while using the opposite electrode as an anode if Tr2 is an n-channel TFT.

The capacitor storage 2312 is formed between the gate and the source of Tr1. The capacitor storage 2312 is provided to maintain the gate-source voltage $V_{GS}$) of Tr1 more securely, but it is not always necessary.

In the pixel shown in FIG. 23, a current to be supplied to the signal line Si is controlled by a power supply of a signal line driving circuit.

Adopting the above circuit structure makes possible constant current driving in which the luminance is kept constant by flowing a constant current into an organic light emitting device. An organic light emitting device that has a mixed region in accordance with the present invention has a longer lifetime than a conventional organic light emitting device, and can have an even longer lifetime when constant current driving as described above is employed. Therefore this circuit structure is effective.

Embodiment 15

The display devices of the present invention which have been described in the embodiments above have advantages of low power consumption and long lifetime. Accordingly, electric appliances that have those display devices as their display units or the like can operate consuming less power than conventional ones and are durable. These advantages are very useful especially for electric appliances that use batteries for power supply, such as portable equipment, because low power consumption leads directly to conveniences (batteries die less frequently).

The above display devices are self-luminous to eliminate the need for back light as the one in liquid crystal displays, and have organic compound films less than 1 μm in thickness to be thin and light-weight. Electric appliances that have these display devices as their display units are accordingly thinner and lighter than conventional ones. This too leads directly to conveniences (lightness and compactness in carrying them around) and is very useful for electric appliances, particularly portable equipment. Moreover, being thin (unvoluminous) is doubtlessly useful for every electric appliance in terms of transportation (a large number of appliances can be transported in a mass) and installation (space-saving).

Being self-luminous, the above display devices are characterized by having better visibility in bright places than liquid crystal display devices and wide viewing angle. Therefore electric appliances that have these display devices as their display units are advantageous also in terms of easiness in viewing display.

To summarize, electric appliances that use display devices of the present invention have, in addition to merits of conventional organic light emitting devices, namely, thinness/lightness and high visibility, new features of low power consumption and long lifetime, and therefore are very useful.

This embodiment shows examples of the electric appliances that have as display units the display devices of the present invention. Specific examples thereof are shown in FIGS. 21A to 21F and FIGS. 22A and 22B. The organic light emitting devices included in the electric appliances of this embodiment can be any organic light emitting device according to the present invention. The display devices included in the electric appliances of this embodiment can have any of the configurations illustrated in FIGS. 13A to 20C.

Figure 21A:
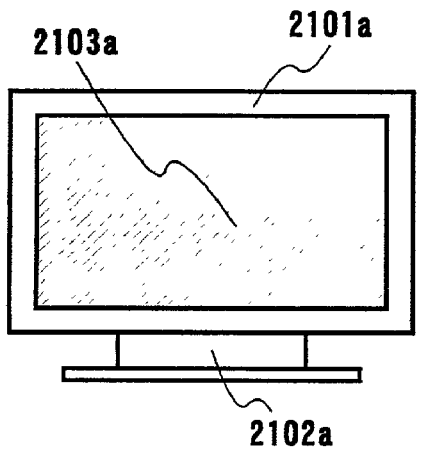
FIGS. 21A to 21F are diagrams showing specific examples of an electric appliance.

FIG. 21A shows a display using an organic light emitting device. The display is composed of a case 2101a, a support base 2102a, and a display unit 2103a. By using a display device of the present invention as the display unit 2103a, the display can be thin and light-weight, as well as durable. Accordingly, transportation is simplified, space is saved in installation, and lifetime is long.

Figure 21B:
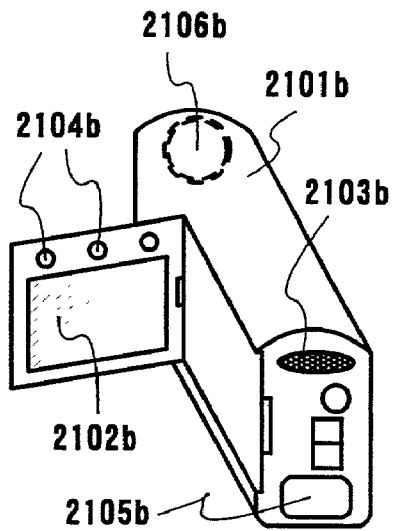

FIG. 21B shows a video camera, which is composed of a main body 2101b, a display unit 2102b, an audio input unit 2103b, operation switches 2104b, a battery 2105b, and an image receiving unit 2106b. By using a display device of the present invention as the display unit 2102b, the video camera can be light-weight, and consumes less power. Accordingly, battery consumption is reduced and carrying the video camera is less inconvenient.

Figure 21C:
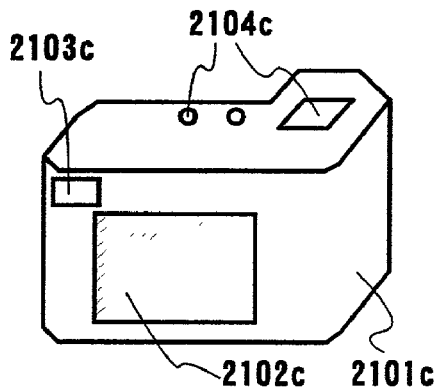

FIG. 21C shows a digital camera, which is composed of a main body 2101c, a display unit 2102c, an eye piece unit 2103c, and operation switches 2104c. By using a display device of the present invention as the display unit 2102c, the digital camera can be light-weight, and consumes less power. Accordingly, battery consumption is reduced and carrying the digital camera is less inconvenient.

Figure 21D:
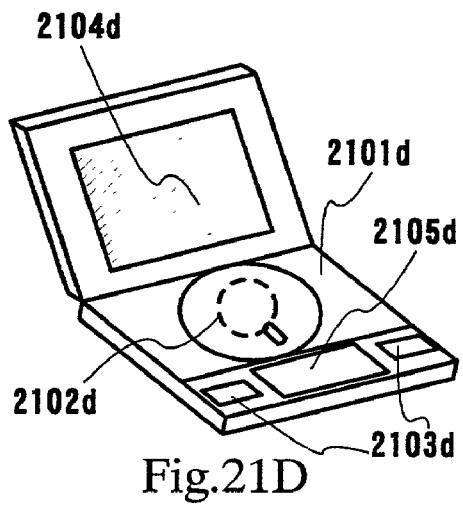

FIG. 21D shows an image reproducing device equipped with a recording medium. The device is composed of a main body 2101d, a recording medium (such as CD, LD, or DVD) 2102d, operation switches 2103d, a display unit (A) 2104d, and a display unit (B) 2105d. The display unit (A) 2104d mainly displays image information whereas the display unit (B) 2105d mainly displays text information. By using display devices of the present invention as the display unit (A) 2104d and the display unit (B) 2105d, the image reproducing device consumes less power and can be lightweight as well as durable. This image reproducing device equipped with a recording medium may be a CD player, a game machine, or the like.

Figure 21E:
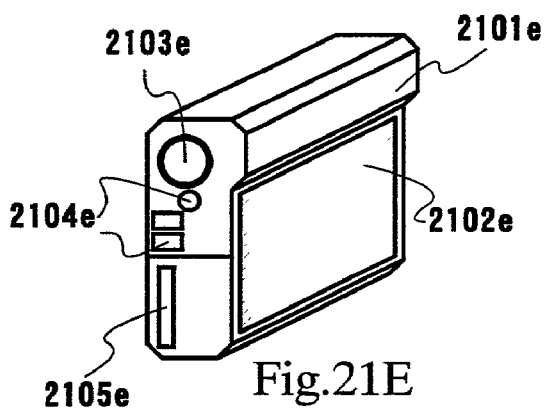

FIG. 21E shows a portable (mobile) computer, which is composed of a main body 2101e, a display unit 2102e, an image receiving unit 2103e, an operation switch 2104e, and a memory slot 2105e. By using a display device of the present invention as the display unit 2102e, the portable computer can be thin and light-weight, and consumes less power. Accordingly, battery consumption is reduced and carrying the computer is less inconvenient. The portable computer can store information in recording media obtained by integrating flash memories or non-volatile memories and can reproduce the stored information.

Figure 21F:
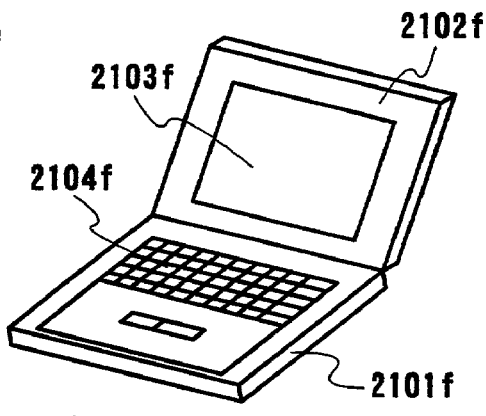

FIG. 21F shows a personal computer, which is composed of a main body 2101f, a case 2102f, a display unit 2103f, and a keyboard 2104f. By using a display device of the present invention as the display unit 2103f, the personal computer can be thin and light-weight, and consumes less power. The display device of the present invention is a great merit in terms of battery consumption and lightness especially for a notebook computer or other personal computers that are carried around.

These electric appliances now display with increasing frequency information, especially, animation information, sent through electronic communication lines such as the Internet and through wireless communication such as radio. Since organic light emitting devices have very fast response speed, they are suitable for animation display.

Figure 22A:
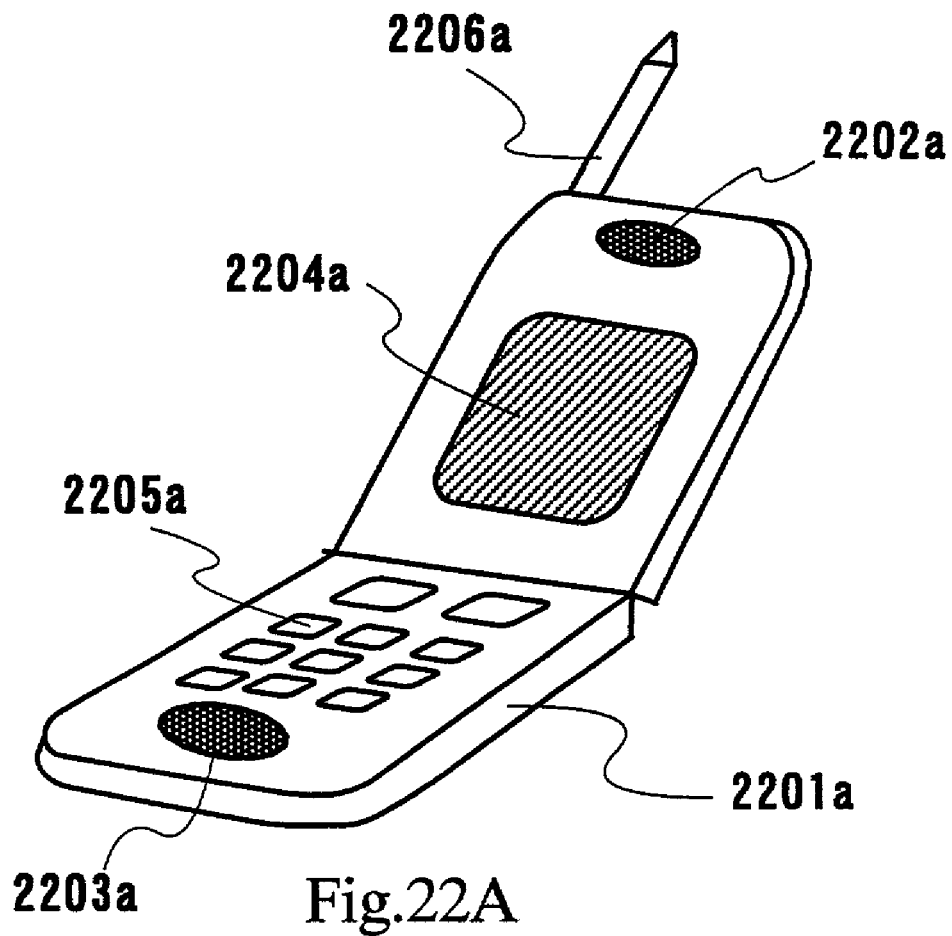
FIGS. 22A and 22B are diagrams showing specific examples of an electric appliance.

FIG. 22A shows a cellular phone, which is composed of a main body 2201a, an audio output unit 2202a, an audio input unit 2203a, a display unit 2204a, operation switches 2205a, and an antenna 2206a. By using a display device of the present invention as the display unit 2204a, the cellular phone can be thin and light-weight, and consumes less power. Accordingly, battery consumption is reduced, carrying the cellular phone is easy, and the main body is compact.

Figure 22B:
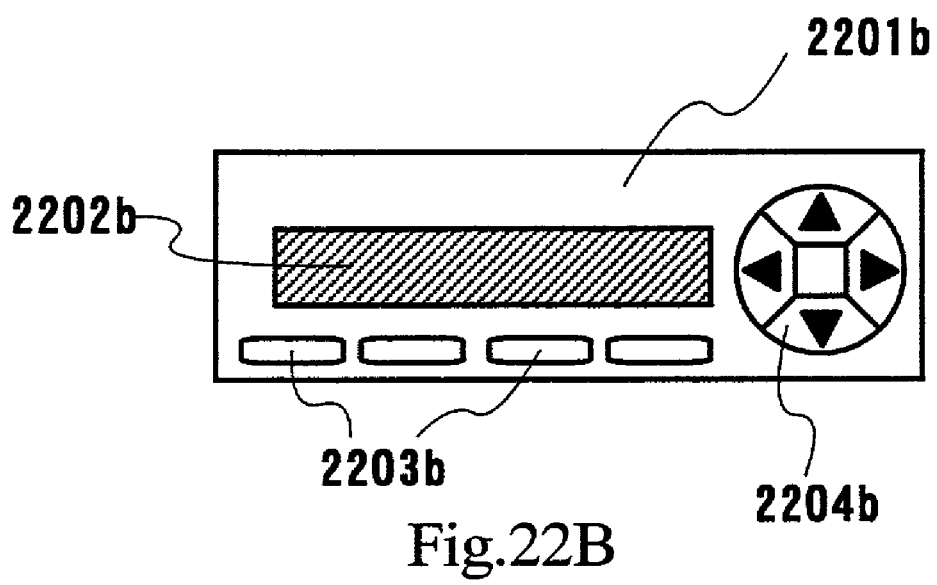

FIG. 22B shows audio (specifically, car audio), which is composed of a main body 220 1b, a display unit 2202b, and operation switches 2203b and 2204b. By using a display device of the present invention as the display unit 2202b, the audio can be light-weight, and consumes less power. Although car audio is taken as an example in this embodiment, it may be home audio.

It is effective to give the electric appliances shown in FIGS. 21A to 21F and FIGS. 22A and 22B a function of modulating the luminance of emitted light in accordance with the brightness of the surroundings where the electric appliances are used by providing the electric appliances with photo sensors as measures to detect the brightness of the surroundings. A user can recognize image or text information without difficulties if the contrast ratio of the luminance of emitted light to the brightness of the surroundings is 100 to 150. With this function, the luminance of an image can be raised for better viewing when the surroundings are bright whereas the luminance of an image can be lowered to reduce power consumption when the-surroundings are dark.

A display device using as a light source an organic light emitting device of the present invention is also very effective since the display device is thin and light weight and can operate consuming less power. A white organic light emitting device in particular can be used for a light source such as back light or front light of a liquid crystal display device. Accordingly, an electric appliance that has this liquid crystal display device too is thin and light weight and can operate consuming less power.

When liquid crystal displays are used as the display units of the electric appliances shown in FIGS. 21A to 21F and FIGS. 22A and 22B according to this embodiment, the electric appliances still can be thin and light-weight and consume less power if those liquid crystal displays use as back light or front light the light emitting devices of the present invention.

By carrying out the present invention, a display device that consumes less power and has long lifetime can be obtained. Furthermore, a durable electric appliance that displays a bright image with less power consumption can be obtained by using this display device as a display unit of the appliance.

What is claimed is:

1. A blue organic light emitting device comprising an organic compound film interposed between an anode and a cathode, the organic compound film comprising:
   a hole transporting region comprising a hole transporting material on the anode;
   a first mixed region comprising the hole transporting material and a host material on the hole transporting region;
   a light emitting region comprising the host material and a blue light emitting material doped into the host material, on the first mixed region;
   a second mixed region comprising the host material and an electron transporting material on the light emitting region; and
   an electron transporting region comprising the electron transporting material on the second mixed region;
   wherein the light emitting region does not include the hole transporting material and the electron transporting material.

2. A full color display device comprising:
   a blue organic light emitting device according to claim 1; and
   a member comprising a fluorescent material that is capable of absorbing blue light emitted from the blue organic light emitting device and emitting green light or red light.

3. An full color display device according to claim 2, the full color device is included in one of the group consisting of a video camera, a digital camera, a portable computer, a personal computer, and a cellular phone.

4. The blue organic light emitting device according to claim 1 wherein said light emitting device is an active matrix type display device.

5. The blue organic light emitting device according to claim 1, wherein the light emitting region is doped with 5 wt % of the blue light emitting material.

6. A full color display device comprising a blue organic light emitting device comprising an organic compound film interposed between an anode and a cathode, the organic compound film comprising:
- a hole transporting region comprising a hole transporting material on the anode;
- a first mixed region comprising the hole transporting material and a host material on the hole transporting region;
- a light emitting region comprising the host material and a blue light emitting material doped into the host material, on the first mixed region;
- a second mixed region comprising the host material and an electron transporting material on the light emitting region;
- an electron transporting region comprising the electron transporting material on the second mixed region; and
- a member comprising a fluorescent material that is capable of absorbing blue light emitted from the blue organic light emitting device and emitting green light or red light;
- wherein the light emitting region does not include the hole transporting material and the electron transporting material.

7. An full color display device according to claim 6, the full color device is included in one of the group consisting of a video camera, a digital camera, a portable computer, a personal computer, and a cellular phone.

8. The blue organic light emitting device according to claim 6 wherein said light emitting device is an active matrix type display device.

9. The blue organic light emitting device according to claim 6, wherein the light emitting region is doped with 5 wt % of the blue light emitting material.

* * * * *